US012792954B2

(12) United States Patent
Cao et al.

(10) Patent No.: US 12,792,954 B2
(45) Date of Patent: Nov. 10, 2026

(54) METHODS FOR GENERATING CHARACTERISTIC PATTERN AND TRAINING MACHINE LEARNING MODEL

(71) Applicant: ASML NETHERLANDS B.V., Veldhoven (NL)

(72) Inventors: Yu Cao, Saratoga, CA (US); Greggory Scranton, San Jose, CA (US); Jing Su, Fremont, CA (US); Yi Zou, Foster City, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 983 days.

(21) Appl. No.: 17/641,159

(22) PCT Filed: Aug. 21, 2020

(86) PCT No.: PCT/EP2020/073449

§ 371 (c)(1),
(2) Date: Mar. 8, 2022

(87) PCT Pub. No.: WO2021/052712

PCT Pub. Date: Mar. 25, 2021

(65) Prior Publication Data

US 2022/0335333 A1 Oct. 20, 2022

Related U.S. Application Data

(60) Provisional application No. 62/900,887, filed on Sep. 16, 2019.

(51) Int. Cl.
*G06N 20/00* (2019.01)
*G03F 1/36* (2012.01)
(Continued)

(52) U.S. Cl.
CPC ............... *G06N 20/00* (2019.01); *G03F 1/36* (2013.01); *G03F 7/70441* (2013.01); *G06N 3/045* (2023.01); *G06N 3/0475* (2023.01)

(58) Field of Classification Search
CPC ........ G06N 20/00; G06N 3/045; G06N 3/047; G06N 3/088; G06N 3/0475; G06N 3/094;
(Continued)

(56) References Cited

U.S. PATENT DOCUMENTS 5,229,872 A 7/1993 Mumola
6,046,792 A 4/2000 Van Der Werf et al.
(Continued)

FOREIGN PATENT DOCUMENTS

CN 109313724 2/2019
CN 109976087 7/2019
(Continued)

OTHER PUBLICATIONS

Lv, Wen, Qi Xia, and Shiyuan Liu. "Mask-filtering-based inverse lithography." Journal of Micro/Nanolithography, MEMS, and MOEMS 12.4 (Oct. 1, 2013): 043003-043003. (Year: 2013).*
(Continued)

*Primary Examiner* — Matthew Ell
*Assistant Examiner* — Blaine T Basom
(74) *Attorney, Agent, or Firm* — Pillsbury Winthrop Shaw Pittman LLP

(57) ABSTRACT

Methods of generating a characteristic pattern for a patterning process and training a machine learning model. A method of training a machine learning model configured to generate a characteristic pattern for a mask pattern includes obtaining (i) a reference characteristic pattern that meets a satisfactory threshold related to manufacturing of the mask pattern, and (ii) a continuous transmission mask (CTM) for use in generating the mask pattern; and training, based on
(Continued)

the reference characteristic pattern and the CTM, the machine learning model such that a first metric between the characteristic pattern and the CTM, and a second metric between the characteristic pattern and the reference characteristic pattern is reduced.

25 Claims, 25 Drawing Sheets

(51) Int. Cl.
*G03F 7/00* (2006.01)
*G06N 3/045* (2023.01)
*G06N 3/0475* (2023.01)

(58) Field of Classification Search
CPC .......... G03F 1/36; G03F 7/70441; G03F 1/70; G03F 7/70433; G03F 7/705; G03F 7/70358
See application file for complete search history.

(56) References Cited

U.S. PATENT DOCUMENTS

| | | | | |
|---|---|---|---|---|
| 7,003,758 | B2 | 2/2006 | Ye et al. | |
| 7,587,704 | B2 | 9/2009 | Ye et al. | |
| 7,716,627 | B1 * | 5/2010 | Ungar | G03F 1/00 716/54 |
| 8,490,034 | B1 * | 7/2013 | Torunoglu | G03F 7/70441 716/55 |
| 10,657,213 | B2 * | 5/2020 | Ungar | G03F 1/36 |
| 2007/0061772 | A1 | 3/2007 | Ye et al. | |
| 2009/0157360 | A1 | 6/2009 | Ye et al. | |
| 2015/0022210 | A1 | 1/2015 | Yokosawa et al. | |
| 2020/0134131 | A1 * | 4/2020 | Tien | G06F 30/398 |

FOREIGN PATENT DOCUMENTS

| | | |
|---|---|---|
| JP | 2003198891 | 7/2003 |
| WO | 2019162346 | 8/2019 |

OTHER PUBLICATIONS

Wang, Shibing, et al. "Machine learning assisted SRAF placement for full chip." Photomask Technology (Oct. 16, 2017). vol. 10451. SPIE. (Year: 2017).*

Yang, Haoyu, et al. "GAN-OPC: Mask optimization with lithography-guided generative adversarial nets." Proceedings of the 55th Annual Design Automation Conference. (Jun. 24, 2018) pp. 1-6. (Year: 2018).*

Feng, Yaobin, et al. "Freeform mask optimization using advanced image based M3D inverse lithography and 3D-NAND full chip OPC application." Optical Microlithography XXXI. (Mar. 20, 2018) vol. 10587. SPIE. (Year: 2018).*

Ye, Wei, et al. "LithoGAN: End-to-end lithography modeling with generative adversarial networks." Proceedings of the 56th Annual Design Automation Conference 2019. (Jun. 2, 2019) pp. 1-6. (Year: 2019).*

Alawieh, Mohamed Baker, et al. "GAN-SRAF: Sub-resolution assist feature generation using conditional generative adversarial networks." Proceedings of the 56th Annual Design Automation Conference 2019. (Jun. 2, 2019) pp. 1-6. (Year: 2019).*

Wang, Yaxing, et al. "Transferring GANs: generating images from limited data." arXiv preprint arXiv:1805.01677. (Year: 2018).*

Szabó, Attila, and Paolo Favaro. "Unsupervised 3d shape learning from image collections in the wild." arXiv preprint arXiv:1811.10519. (Year: 2018).*

International Search Report and Written Opinion issued in corresponding PCT Patent Application No. PCT/EP2020/073449, dated Dec. 15, 2020.

Spence, C.: "Full-Chip Lithography Simulation and Design Analysis—How OPC Is Changing IC Design", Proc. of SPIE, vol. 5751, pp. 1-14 (2005).

Office Action issued in corresponding Chinese Patent Application No. 202080064756, dated Dec. 28, 2024.

Office Action issued in corresponding Chinese Patent Application No. 202080064756.3, dated Jul. 24, 2025.

* cited by examiner

METHODS FOR GENERATING CHARACTERISTIC PATTERN AND TRAINING MACHINE LEARNING MODEL

CROSS-REFERENCE TO RELATED APPLICATIONS

This application is the U.S. national phase entry of PCT Patent Application No. PCT/EP2020/073449 which was filed on Aug. 21, 2020, which claims the benefit of priority of U.S. Provisional Application No. 62/900,887 which was filed on Sep. 16, 2019 and which is incorporated herein in its entirety by reference.

TECHNICAL FIELD

The description herein relates generally to apparatus and methods of a patterning process and determining characteristic patterns corresponding to a design layout.

BACKGROUND

A lithographic projection apparatus can be used, for example, in the manufacture of integrated circuits (ICs). In such a case, a patterning device (e.g., a mask) may contain or provide a pattern corresponding to an individual layer of the IC ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion through the pattern on the patterning device. In general, a single substrate contains a plurality of adjacent target portions to which the pattern is transferred successively by the lithographic projection apparatus, one target portion at a time. In one type of lithographic projection apparatuses, the pattern on the entire patterning device is transferred onto one target portion in one go; such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic projection apparatus will have a reduction ratio M (e.g., 4), the speed F at which the substrate is moved will be 1/M times that at which the projection beam scans the patterning device. More information with regard to lithographic devices as described herein can be gleaned, for example, from U.S. Pat. No. 6,046,792, incorporated herein by reference.

Prior to transferring the pattern from the patterning device to the substrate, the substrate may undergo various procedures, such as priming, resist coating and a soft bake. After exposure, the substrate may be subjected to other procedures ("post-exposure procedures"), such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate.

These devices are then separated from one another by a technique such as dicing or sawing, whence the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

As noted, lithography is a central step in the manufacturing of device such as ICs, where patterns formed on substrates define functional elements of the devices, such as microprocessors, memory chips, etc. Similar lithographic techniques are also used in the formation of flat panel displays, micro-electro mechanical systems (MEMS) and other devices.

As semiconductor manufacturing processes continue to advance, the dimensions of functional elements have continually been reduced while the amount of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-$k_1$ lithography, according to the resolution formula $CD=k_1 \times \lambda/NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a designer in order to achieve particular electrical functionality and performance. To overcome these difficulties, sophisticated fine-tuning steps are applied to the lithographic projection apparatus, the design layout, or the patterning device. These include, for example, but not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET). The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

SUMMARY

According to an embodiment, there is provided a method of training a machine learning model configured to generate a characteristic pattern for a mask pattern. The method includes obtaining (i) a reference characteristic pattern that meets a satisfactory threshold related to manufacturing of the mask pattern and a sharpness threshold, and (ii) a continuous transmission mask (CTM) for use in generating the mask pattern; and training, based on the reference characteristic pattern and the CTM, the machine learning model such that a first metric between the characteristic pattern and the CTM, and a second metric between the characteristic pattern and the reference characteristic pattern is reduced.

Furthermore, there is provided a method of training a machine learning model configured to generate a characteristic pattern for a mask pattern. The method includes obtaining (a) the machine learning model comprising: (i) a generator model configured to generate the characteristic pattern from a continuous transmission mask (CTM); and (ii) a discriminator model configured to determines whether an input pattern meets a satisfactory threshold related to the manufacturing of the mask pattern and a sharpness threshold, and (b) a reference characteristic pattern that meets the satisfactory threshold related to manufacturing of the mask pattern and the sharpness threshold; and training the generator model and the discriminator model in a cooperative manner such that: (i) the generator model generates the characteristic pattern using the CTM, and the discriminator model determines that the characteristic pattern and the reference characteristic pattern as meeting the satisfactory threshold including the sharpness threshold, and (ii) a metric between the generated characteristic pattern and the CTM is reduced.

Furthermore, there is provided a method of training a machine learning model configured to generate a characteristic pattern for a mask pattern. The method includes obtaining (a) the machine learning model comprising: (i) a trained generator model configured to generate the characteristic pattern from an input vector; and (ii) an encoder model for converting an input image to a one dimensional (1D) vector, and (b) a continuous transmission mask (CTM) used for generating the mask pattern; and training the encoder model in cooperation with the trained generator model. The training includes executing the encoder model using the CTM as the input image to generate the 1D vector; executing the trained generator model using the generated 1D vector as the input vector to generate the characteristic pattern; and adjusting model parameters of the encoder model such that a metric between the generated characteristic pattern and the CTM is reduced.

Furthermore, there is provided a method of training a machine learning model configured to generate a characteristic pattern for a mask pattern. The method includes obtaining the machine learning model comprising: (i) an encoder model for converting an input image to a one dimensional (1D) vector; and (ii) a decoder model configured to generate the characteristic pattern from an input vector; and training the encoder model in cooperation with the decoder model. The training includes executing the encoder model using a reference characteristic pattern as the input image to generate the 1D vector, wherein the reference characteristic pattern meets a satisfactory threshold associated with manufacturing the mask pattern; executing the decoder model using the generated 1D vector as the input vector to generate the characteristic pattern; and adjusting model parameters of the encoder model and the decoder model such that a metric between the generated characteristic pattern and the reference characteristic pattern is reduced.

In an embodiment, the method of training further includes a second stage of training. The second stage includes obtaining a second encoder model configured to convert a continuous transmission mask (CTM) used for generating the mask pattern to the 1D vector; and training the second encoder model in cooperation with the trained decoder model. The training of the second encoder includes executing the second encoder model using the CTM as the input image to generate the 1D vector; executing the trained decoder model using the generated 1D vector as the input vector to generate the characteristic pattern; and adjusting model parameters of the second encoder model such that another metric between the generated characteristic pattern and the CTM is reduced and/or a performance metric associated with a patterning process is reduced.

Furthermore, there is provided a method of training a machine learning model configured to generate a characteristic pattern for a mask pattern. The method includes obtaining (i) a reference characteristic pattern that meets a satisfactory threshold related to manufacturing of the mask pattern and a sharpness threshold, and (ii) a target pattern; and training, based on the reference characteristic pattern and the target, the machine learning model such that a metric between the characteristic pattern and the reference characteristic pattern is reduced and a performance metric associated with a patterning process is reduced.

Furthermore, there is provided a method of training a machine learning model configured to generate a characteristic pattern for a mask pattern. The method includes obtaining (a) the machine learning model comprising: (i) a trained generator model configured to generate the characteristic pattern from an input vector; and (ii) an encoder model for converting an input image to a one dimensional (1D) vector, and (b) a target pattern; and training the encoder model in cooperation with the trained generator model. The training includes executing the encoder model using the target pattern as the input image to generate the 1D vector; executing the trained generator model using the generated 1D vector as the input vector to generate the characteristic pattern; and adjusting model parameters of the encoder model such that a performance metric of a patterning process is reduced. In an embodiment, the performance metric is determined, via simulating the patterning process using the mask pattern including the characteristic pattern.

Furthermore, there is provided a method of training a machine learning model configured to generate a characteristic pattern for a mask pattern. The method includes obtaining the machine learning model comprising: (i) an encoder model for converting an input image to a one dimensional (1D) vector; and (ii) a decoder model configured to generate the characteristic pattern from an input vector; and training the encoder model in cooperation with the decoder model. The training includes executing the encoder model using a reference characteristic pattern as the input image to generate the 1D vector, wherein the reference characteristic pattern meets a satisfactory threshold associated with manufacturing the mask pattern; executing the decoder model using the generated 1D vector as the input vector to generate the characteristic pattern; and adjusting model parameters of the encoder model and the decoder model such that a metric between the generated characteristic pattern and the reference characteristic pattern is reduced.

In an embodiment, the method of training further includes a second stage of training. The second stage includes obtaining a second encoder model configured to convert a target pattern to the 1D vector; and training the second encoder model in cooperation with the trained decoder model. The training of the second encoder includes executing the second encoder model using the target pattern as the input image to generate the 1D vector; executing the trained decoder model using the generated 1D vector as the input vector to generate the characteristic pattern; and adjusting model parameters of the second encoder model such that a performance metric of a patterning process is reduced. In an embodiment, the performance metric is determined, via simulating the patterning process using the mask pattern including the characteristic pattern.

Furthermore, there is provided a method of training a machine learning model configured to generate a characteristic pattern for a mask pattern. The method includes obtaining (i) a reference characteristic pattern that meets a satisfactory threshold related to manufacturing of the mask pattern and a sharpness threshold, and (ii) a continuous transmission mask (CTM) for use in generating the mask pattern; and training, based on the reference characteristic pattern and the CTM, the machine learning model such that a difference between the characteristic pattern and the reference characteristic pattern is reduced.

Furthermore, there is provided a computer program product comprising a non-transitory computer readable medium having instructions recorded thereon, the instructions when executed by a computer implementing the steps of any of the method above.

BRIEF DESCRIPTION OF THE DRAWINGS

The above aspects and other aspects and features will become apparent to those ordinarily skilled in the art upon review of the following description of specific embodiments in conjunction with the accompanying figures, wherein.

DETAILED DESCRIPTION

Figure 1:
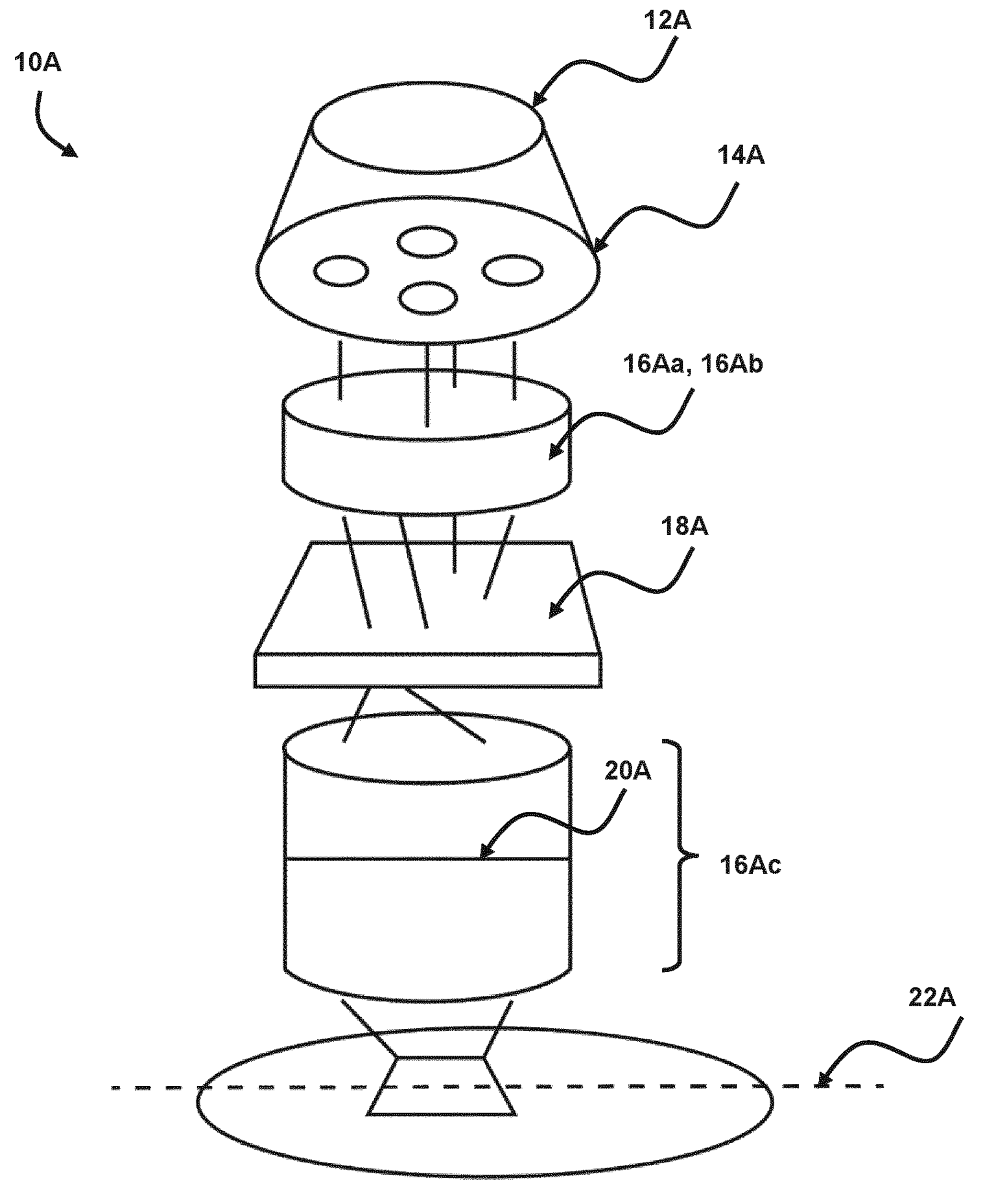
FIG. 1 shows a block diagram of various subsystems of a lithography system, according to an embodiment.

Before describing embodiments in detail, it is instructive to present an example environment in which embodiments may be implemented.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms “reticle”, “wafer” or “die” in this text should be considered as interchangeable with the more general terms “mask”, “substrate” and “target portion”, respectively.

In the present document, the terms “radiation” and “beam” are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The patterning device can comprise, or can form, one or more design layouts. The design layout can be generated utilizing CAD (computer-aided design) programs, this process often being referred to as EDA (electronic design automation). Most CAD programs follow a set of predetermined design rules in order to create functional design layouts/patterning devices. These rules are set by processing and design limitations. For example, design rules define the space tolerance between devices (such as gates, capacitors, etc.) or interconnect lines, so as to ensure that the devices or lines do not interact with one another in an undesirable way. One or more of the design rule limitations may be referred to as "critical dimension" (CD). A critical dimension of a device can be defined as the smallest width of a line or hole or the smallest space between two lines or two holes. Thus, the CD determines the overall size and density of the designed device. Of course, one of the goals in device fabrication is to faithfully reproduce the original design intent on the substrate (via the patterning device).

The pattern layout design may include, as an example, application of resolution enhancement techniques, such as optical proximity corrections (OPC). OPC addresses the fact that the final size and placement of an image of the design layout projected on the substrate will not be identical to, or simply depend only on the size and placement of the design layout on the patterning device. It is noted that the terms "mask", "reticle", "patterning device" are utilized interchangeably herein. Also, person skilled in the art will recognize that, the term "mask," "patterning device" and "design layout" can be used interchangeably, as in the context of RET, a physical patterning device is not necessarily used but a design layout can be used to represent a physical patterning device. For the small feature sizes and high feature densities present on some design layout, the position of a particular edge of a given feature will be influenced to a certain extent by the presence or absence of other adjacent features. These proximity effects arise from minute amounts of radiation coupled from one feature to another or non-geometrical optical effects such as diffraction and interference. Similarly, proximity effects may arise from diffusion and other chemical effects during post-exposure bake (PEB), resist development, and etching that generally follow lithography.

In order to increase the chance that the projected image of the design layout is in accordance with requirements of a given target circuit design, proximity effects may be predicted and compensated for, using sophisticated numerical models, corrections or pre-distortions of the design layout. The article "Full-Chip Lithography Simulation and Design Analysis—How OPC Is Changing IC Design", C. Spence, Proc. SPIE, Vol. 5751, pp 1-14 (2005) provides an overview of current "model-based" optical proximity correction processes. In a typical high-end design almost every feature of the design layout has some modification in order to achieve high fidelity of the projected image to the target design. These modifications may include shifting or biasing of edge positions or line widths as well as application of "assist" features that are intended to assist projection of other features.

An assist feature may be viewed as a difference between features on a patterning device and features in the design layout. The terms "main feature" and "assist feature" do not imply that a particular feature on a patterning device must be labeled as one or the other.

The term "mask" or "patterning device" as employed in this text may be broadly interpreted as referring to a generic patterning device that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning devices include:

- a programmable mirror array. An example of such a device is a matrix-addressable surface having a viscoelastic control layer and a reflective surface. The basic principle behind such an apparatus is that (for example) addressed areas of the reflective surface reflect incident radiation as diffracted radiation, whereas unaddressed areas reflect incident radiation as undiffracted radiation. Using an appropriate filter, the said undiffracted radiation can be filtered out of the reflected beam, leaving only the diffracted radiation behind; in this manner, the beam becomes patterned according to the addressing pattern of the matrix-addressable surface. The required matrix addressing can be performed using suitable electronic means.
- a programmable LCD array. An example of such a construction is given in U.S. Pat. No. 5,229,872, which is incorporated herein by reference.

As a brief introduction, FIG. 1 illustrates an exemplary lithographic projection apparatus 10A. Major components are a radiation source 12A, which may be a deep-ultraviolet excimer laser source or other type of source including an extreme ultra violet (EUV) source (as discussed above, the lithographic projection apparatus itself need not have the radiation source), illumination optics which, e.g., define the partial coherence (denoted as sigma) and which may include optics 14A, 16Aa and 16Ab that shape radiation from the source 12A; a patterning device 18A; and transmission optics 16Ac that project an image of the patterning device pattern onto a substrate plane 22A. An adjustable filter or aperture 20A at the pupil plane of the projection optics may restrict the range of beam angles that impinge on the substrate plane 22A, where the largest possible angle defines the numerical aperture of the projection optics NA=n sin ($\Theta_{max}$), wherein n is the refractive index of the media between the substrate and the last element of the projection optics, and $\Theta_{max}$ is the largest angle of the beam exiting from the projection optics that can still impinge on the substrate plane 22A.

In a lithographic projection apparatus, a source provides illumination (i.e. radiation) to a patterning device and projection optics direct and shape the illumination, via the patterning device, onto a substrate. The projection optics may include at least some of the components 14A, 16Aa, 16Ab and 16Ac. An aerial image (AI) is the radiation intensity distribution at substrate level. A resist layer on the substrate is exposed and the aerial image is transferred to the resist layer as a latent "resist image" (RI) therein. The resist image (RI) can be defined as a spatial distribution of solubility of the resist in the resist layer. A resist model can be used to calculate the resist image from the aerial image, an example of which can be found in U.S. Patent Application Publication No. US 2009-0157360, the disclosure of which is hereby incorporated by reference in its entirety. The resist model is related only to properties of the resist layer (e.g., effects of chemical processes which occur during exposure, PEB and development). Optical properties of the lithographic projection apparatus (e.g., properties of the source, the patterning device and the projection optics) dictate the aerial image. Since the patterning device used in the lithographic projection apparatus can be changed, it may be desirable to separate the optical properties of the patterning device from the optical properties of the rest of the lithographic projection apparatus including at least the source and the projection optics.

Although specific reference may be made in this text to the use of lithography apparatus in the manufacture of ICs, it should be understood that the lithography apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

Various patterns on or provided by a patterning device may have different process windows. i.e., a space of processing variables under which a pattern will be produced within specification. Examples of pattern specifications that relate to potential systematic defects include checks for necking, line pull back, line thinning, CD, edge placement, overlapping, resist top loss, resist undercut and/or bridging. The process window of all the patterns on a patterning device or an area thereof may be obtained by merging (e.g., overlapping) process windows of each individual pattern. The boundary of the process window of all the patterns contains boundaries of process windows of some of the individual patterns. In other words, these individual patterns limit the process window of all the patterns. These patterns can be referred to as "hot spots" or "process window limiting patterns (PWLPs)," which are used interchangeably herein. When controlling a part of a patterning process, it is possible and economical to focus on the hot spots. When the hot spots are not defective, it is most likely that all the patterns are not defective.

In an embodiment, simulation based approaches have been developed to verify the correctness of the design and mask layout before the mask is fabricated. One such approach is described in U.S. Pat. No. 7,003,758, entitled "System and Method for Lithography Simulation," the subject matter of which is hereby incorporated by reference in its entirety and is referred to herein as "the simulation system." Even with the best possible RET implementation and verification, it is still not possible to optimize every feature of a design. Some structures will often not be properly corrected due to limitations of the technology, implementation errors, or conflicts with neighboring features. The simulation system can identify specific features of the design that will result in unacceptably small process windows or excessive critical dimension (CD) variation within the normally expected range of process conditions, such as focus and exposure variation. These defective regions must be corrected before the mask is made. However, even in the best designs, there will be structures or parts of structures that cannot be optimally corrected. Although these weak areas can produce good chips, they may have marginally acceptable process windows and are likely to be the first locations within the device that will fail under varying process conditions, either due to variations of the wafer processing conditions, the mask processing conditions, or a combination of both. These weak areas are referred to herein as "hot spots."

Figure 2:
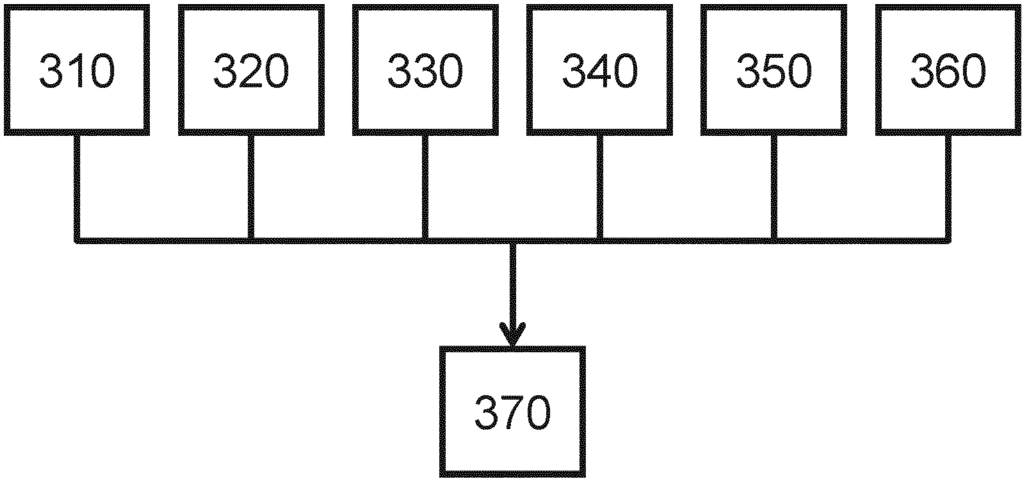
FIG. 2 shows example categories of the processing variables, according to an embodiment.

Variables of a patterning process are called "processing variables." The term processing variables may also be interchangeably referred as "parameters of the patterning process" or "processing parameters." The patterning process may include processes upstream and downstream to the actual transfer of the pattern in a lithography apparatus. FIG. 2 shows example categories of the processing variables 370. The first category may be variables 310 of the lithography apparatus or any other apparatuses used in the lithography process. Examples of this category include variables of the illumination, projection system, substrate stage, etc. of a lithography apparatus. The second category may be variables 320 of one or more procedures performed in the patterning process. Examples of this category include focus control or focus measurement, dose control or dose measurement, bandwidth, exposure duration, development temperature, chemical composition used in development, etc. The third category may be variables 330 of the design layout and its implementation in, or using, a patterning device. Examples of this category may include shapes and/or locations of assist features, adjustments applied by a resolution enhancement technique (RET), CD of mask features, etc. The fourth category may be variables 340 of the substrate. Examples include characteristics of structures under a resist layer, chemical composition and/or physical dimension of the resist layer, etc. The fifth category may be characteristics 350 of temporal variation of one or more variables of the patterning process. Examples of this category include a characteristic of high frequency stage movement (e.g., frequency, amplitude, etc.), high frequency laser bandwidth change (e.g., frequency, amplitude, etc.) and/or high frequency laser wavelength change. These high frequency changes or movements are those above the response time of mechanisms to adjust the underlying variables (e.g., stage position, laser intensity). The sixth category may be characteristics 360 of processes upstream of, or downstream to, pattern transfer in a lithographic apparatus, such as spin coating, post-exposure bake (PEB), development, etching, deposition, doping and/or packaging.

As will be appreciated, many, if not all of these variables, will have an effect on a parameter of the patterning process and often a parameter of interest. Non-limiting examples of parameters of the patterning process may include critical dimension (CD), critical dimension uniformity (CDU), focus, overlay, edge position or placement, sidewall angle, pattern shift, etc. Often, these parameters express an error from a nominal value (e.g., a design value, an average value, etc.). The parameter values may be the values of a characteristic of individual patterns or a statistic (e.g., average, variance, etc.) of the characteristic of a group of patterns.

The values of some or all of the processing variables, or a parameter related thereto, may be determined by a suitable method. For example, the values may be determined from data obtained with various metrology tools (e.g., a substrate metrology tool). The values may be obtained from various sensors or systems of an apparatus in the patterning process (e.g., a sensor, such as a leveling sensor or alignment sensor, of a lithography apparatus, a control system (e.g., a substrate or patterning device table control system) of a lithography apparatus, a sensor in a track tool, etc.). The values may be from an operator of the patterning process.

Figure 3:
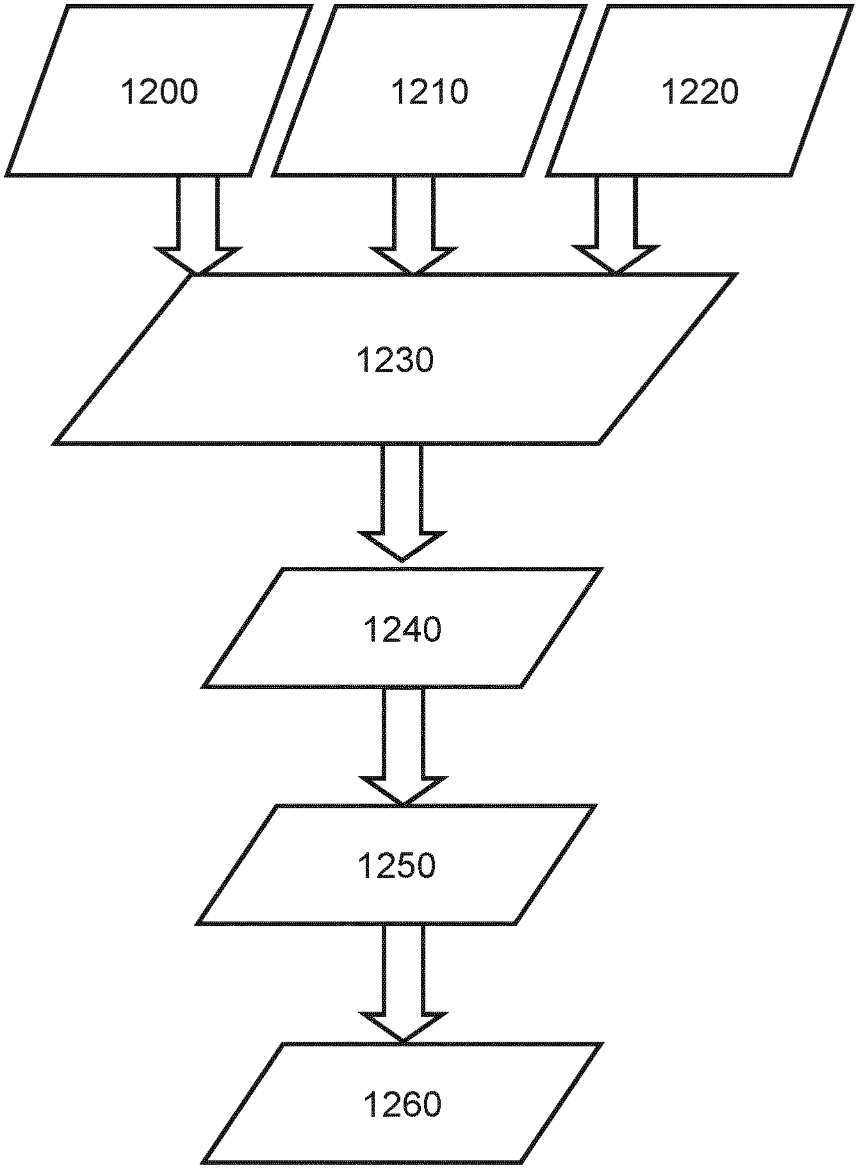
FIG. 3 is a flow chart for modelling and/or simulating parts of a patterning process, according to an embodiment.

An exemplary flow chart for modelling and/or simulating parts of a patterning process is illustrated in FIG. 3. As will be appreciated, the models may represent a different patterning process and need not comprise all the models described below. A source model 1200 represents optical characteristics (including radiation intensity distribution, bandwidth and/or phase distribution) of the illumination of a patterning device. The source model 1200 can represent the optical characteristics of the illumination that include, but not limited to, numerical aperture settings, illumination sigma (a) settings as well as any particular illumination shape (e.g. off-axis radiation shape such as annular, quadrupole, dipole, etc.), where Q (or sigma) is outer radial extent of the illuminator.

A projection optics model 1210 represents optical characteristics (including changes to the radiation intensity distribution and/or the phase distribution caused by the projection optics) of the projection optics. The projection optics model 1210 can represent the optical characteristics of the projection optics, including aberration, distortion, one or more refractive indexes, one or more physical sizes, one or more physical dimensions, etc.

The patterning device/design layout model module 1220 captures how the design features are laid out in the pattern of the patterning device and may include a representation of detailed physical properties of the patterning device, as described, for example, in U.S. Pat. No. 7,587,704, which is incorporated by reference in its entirety. In an embodiment, the patterning device/design layout model module 1220 represents optical characteristics (including changes to the radiation intensity distribution and/or the phase distribution caused by a given design layout) of a design layout (e.g., a device design layout corresponding to a feature of an integrated circuit, a memory, an electronic device, etc.), which is the representation of an arrangement of features on or formed by the patterning device. Since the patterning device used in the lithographic projection apparatus can be changed, it is desirable to separate the optical properties of the patterning device from the optical properties of the rest of the lithographic projection apparatus including at least the illumination and the projection optics. The objective of the simulation is often to accurately predict, for example, edge placements and CDs, which can then be compared against the device design. The device design is generally defined as the pre-OPC patterning device layout, and will be provided in a standardized digital file format such as GDSII or OASIS.

An aerial image 1230 can be simulated from the source model 1200, the projection optics model 1210 and the patterning device/design layout model 1220. An aerial image (AI) is the radiation intensity distribution at substrate level. Optical properties of the lithographic projection apparatus (e.g., properties of the illumination, the patterning device and the projection optics) dictate the aerial image.

A resist layer on a substrate is exposed by the aerial image and the aerial image is transferred to the resist layer as a latent "resist image" (RI) therein. The resist image (RI) can be defined as a spatial distribution of solubility of the resist in the resist layer. A resist image 1250 can be simulated from the aerial image 1230 using a resist model 1240. The resist model can be used to calculate the resist image from the aerial image, an example of which can be found in U.S. Patent Application Publication No. US 2009-0157360, the disclosure of which is hereby incorporated by reference in its entirety. The resist model typically describes the effects of chemical processes which occur during resist exposure, post exposure bake (PEB) and development, in order to predict, for example, contours of resist features formed on the substrate and so it typically related only to such properties of the resist layer (e.g., effects of chemical processes which occur during exposure, post-exposure bake and development). In an embodiment, the optical properties of the resist layer, e.g., refractive index, film thickness, propagation and polarization effects—may be captured as part of the projection optics model 1210.

So, in general, the connection between the optical and the resist model is a simulated aerial image intensity within the resist layer, which arises from the projection of radiation onto the substrate, refraction at the resist interface and multiple reflections in the resist film stack. The radiation intensity distribution (aerial image intensity) is turned into a latent "resist image" by absorption of incident energy, which is further modified by diffusion processes and various loading effects. Efficient simulation methods that are fast enough for full-chip applications approximate the realistic 3-dimensional intensity distribution in the resist stack by a 2-dimensional aerial (and resist) image.

In an embodiment, the resist image can be used an input to a post-pattern transfer process model module 1260. The post-pattern transfer process model 1260 defines performance of one or more post-resist development processes (e.g., etch, development, etc.).

Simulation of the patterning process can, for example, predict contours, CDs, edge placement (e.g., edge placement error), etc. in the resist and/or etched image. Thus, the objective of the simulation is to accurately predict, for example, edge placement, and/or aerial image intensity slope, and/or CD, etc. of the printed pattern. These values can be compared against an intended design to, e.g., correct the patterning process, identify where a defect is predicted to occur, etc. The intended design is generally defined as a pre-OPC design layout which can be provided in a standardized digital file format such as GDSII or OASIS or other file format.

Thus, the model formulation describes most, if not all, of the known physics and chemistry of the overall process, and each of the model parameters desirably corresponds to a distinct physical or chemical effect. The model formulation thus sets an upper bound on how well the model can be used to simulate the overall manufacturing process.

In order to print a circuit pattern almost every feature of a design layout of the circuit pattern has some modification so that a high fidelity of a projected image on the substrate to a target design is achieved. These modifications may include shifting or biasing of edge positions or line widths as well as application of "assist" features that are intended to assist projection of other features. These modified design layout is then used to manufacture a patterning device (e.g., a mask). A mask manufacturing has limitations related to a size, shape and positioning of the features (e.g., assist features and main features). Hence, the modified design layout should be modified with certain manufacturing limitations in mind as well.

Currently, one of the most accurate mask design method for generating assist features such as sub-resolution assist feature (SRAF) is a continuous transmission map (CTM) method. The CTM method first designs a grayscale mask, referred to as a continuous transmission map, or CTM. The method involves optimization of grey scale values using a gradient descent, or other optimization methods so that a performance metric (e.g., edge placement error (EPE)) of a lithographic apparatus is improved. However, the CTM cannot be manufactured as a mask itself, since it is a grayscale mask with unmanufacturable features. The CTM is nonetheless viewed as an ideal model which is the basis for a manufacturable mask. After the CTM is optimized, a mask design process proceeds to a bar extraction process. An example CTM optimization process is discussed in detail in U.S. patent publication US20170038692A1, which is incorporated herein in its entirety by reference, that describes different flows of optimization for lithographic processes.

In the bar extraction process, the CTM is used to guide the placement of SRAFs. In an embodiment, the SRAFs may be curved, rectangular or other geometric shape, where the shape is easy to manufacture with e-beam lithography. After the bar extraction process, an edge-based OPC is conducted on the main features (e.g., a target feature of a circuit to be printed on the substrate) of the design layout. In the edge-based OPC, edges of the main features are adjusted to ensure accurate printing of the target pattern on the substrate.

The current bar extraction methods may use heuristics to guide a desired placement and size of SRAFs. These heuristics may not be accurate, and computationally intensive. The existing methods for SRAF generation may rely on inexact heuristics that often have sub-optimal results. When these sub-optimal SRAFs are included in a mask pattern, which is further used in a lithographic apparatus, the resulting performance of the patterning process may not meet a desired performance criterion.

The methods of the present disclosure seek to generate optimized mask designs (e.g., including rectangular or rectilinear features), without any added heuristic rules. In an embodiment, the result will be a mask that is close to a CTM as well as easy to manufacture.

The methods (e.g., related to FIGS. 4-11B, including methods 800, 900, 1000 and 1100) described herein train a machine learning model configured to generate a characteristic pattern. In an embodiment, the characteristic pattern is an extraction friendly map (EFM) that includes features that are easy to extract. In an example, the characteristic pattern includes sub-resolution features and/or main features. The sub-resolution features may be rectilinear in shape. In another example, a sub-resolution feature may include a curved feature.

In an embodiment, the characteristic pattern is generated from a machine learning model trained to closely follow the CTM as well as design rules related to manufacturing of the mask pattern. In an embodiment, a mask manufactured using the characteristic pattern will improve a performance of the patterning process. For example, a lithographic apparatus can employ the mask for printing patterns on a substrate. Such printed pattern will have minimum errors or result in high yield of the patterning process.

In an embodiment, design rules used herein refer to limitation related to manufacturing of the mask, for example, mask rule check (MRC) constraints. In the present disclosure, the design rules herein may be different from design rules (e.g., minimum CD, minimum pitch) associated with a design layout e.g., target patterns that need to be printed on a substrate. For mask patterns, the design rules does not necessarily follow design rules related to design layout. For example, SRAFs can be small and also violate minimum pitch requirement.

In an embodiment, for example, MRC may include parameters such as a relative position of a feature (e.g., SRAFs) with respect neighboring features, a position of an assist feature with respect to main feature or other assist features, a shape and size of a feature, or a combination thereof. For example, the MRC constraint can be a feature having a rectilinear shape, a curved shape having a radius of curvature within a specified range, or a combination thereof. In an embodiment, the design rules may be defined based on heuristics e.g., a user-experience and past printing performance.

In an embodiment, the reference characteristic pattern is generated using a software implementing the heuristic rules and configured to generate assist features (e.g., SRAF) based on these heuristic rules. In an embodiment, the reference characteristic pattern can be an image including assist features distributed around a main feature (e.g., a target feature). In an embodiment, the main feature may be omitted and only SRAFs may be included in the reference characteristic pattern, the CTM, or the characteristic patterns generated using the methods herein. In an embodiment, the reference characteristic pattern meets a satisfactory threshold related to MRC and sharpness of a pattern (or a feature of the pattern). In addition, the reference characteristic pattern includes polygon shapes (e.g., rectangular or curvilinear) as opposed to blurry CTM shapes. For example, a satisfactory threshold can be meeting more than 90% (preferably 100%) of the design rules including rules related to a feature's shape, size, relative position with respect to other the features, etc. In addition, the satisfactory threshold includes a sharpness threshold of a characteristic pattern.

The present methods can be implemented in several different computation or training flows. Each of these flows takes, as an input, a continuous transmission mask (CTM) or target mask image (MI). In the case of the CTM as input, the CTM may already been optimized to print the desired pattern. The output for each method is a characteristic pattern (also referred as an extraction friendly map (EFM)). In an embodiment, the characteristic pattern or EFM may be an image composed exclusively of rectangles that represents an optimized mask design.

In an embodiment, a machine learning model may be trained using a direct supervised learning. For example, the direct supervised learning flow uses a single neural network that is trained on a set of CTM images, and their corresponding reference characteristic pattern images or EFM images that have been generated using the best existing method e.g., a software implementing design rules. Once trained, a CTM image can be inserted as the input, and the trained machine learning model generates an EFM image.

In an embodiment, a machine learning model may be trained using unsupervised learning. To eliminate the need for a training set of CTM images with corresponding EFM images, this unsupervised learning flow uses a cost function with two terms. The first term is a metric to determine how closely an output EFM image resembles an input CTM. The second term is a regularization term that measures how closely the features of EFM resemble a chosen shape (e.g., rectangular) and how closely it follows any other design rules. For example, the machine learning model is trained such that a first metric calculated as a difference between a generated EFM and the CTM, and a second metric between the generated EFM and the reference characteristic pattern is reduced, e.g., minimized. In an embodiment, the second metric is a function of how closely the generated EFM follows a style (e.g., feature sharpness, feature shape, etc.) as well as MRC of the reference pattern. For example, the second metric is a function of a sharpness of the features in the reference EFM and the generated EFM. For example, in image processing, sharpness can be determined by boundaries between zones of different tones (e.g., grey scale values) around a feature. For example, sharpness can be measured as a distance of an edge of a feature wherein a pixel value goes from 10% to 90% of its peak value. The smaller the distance, sharper is the feature. In an embodiment, the distance can be measured in pixels, nanometers, or fraction of feature height and/or length. Detailed steps or procedures related to an unsupervised learning are further discussed with respect to a flow chart of FIG. 8 herein.

In an embodiment, the regularization term can be implemented in a number of ways, for example, based on comparison with a reference EFM. FIGS. 4-6B are examples of unsupervised learning flow.

Figure 4:
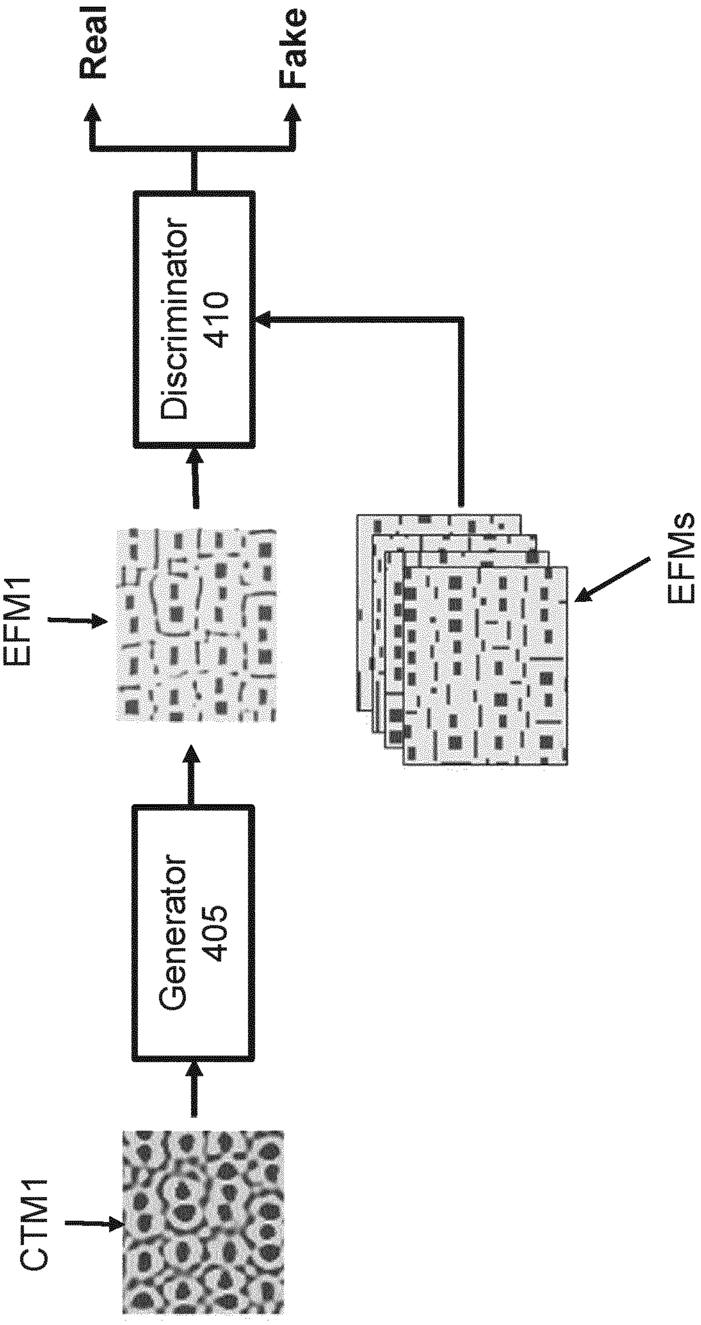
FIG. 4 illustrates an example block diagram of training a machine learning model based on generative adversarial network (GAN) architecture, according to an embodiment.

FIG. 4 illustrates an example block diagram of training a machine learning model based on generative adversarial network (GAN) architecture. The GAN architecture includes two different models called generator model and a discriminator model that are trained in a cooperative manner. For example, the discriminator model is trained using an output from the generator model and a reference characteristic pattern (or a plurality of reference characteristic pattern images). The reference characteristic patterns are different patterns including features (e.g., rectangular shaped) that satisfy design rules. The discriminator is trained to identify an input as “real” or “fake”. A “real” input or a real pattern is one that obeys the design rules as well as a sharpness associated a feature e.g., represented by a reference characteristic pattern image, and a “fake” input is one that does not satisfy the design rules. In an embodiment, the “real” pattern is one that meets the satisfactory threshold related to MRC and sharpness of a feature. For example, the satisfactory threshold may be meeting more than 90% (preferably 100%) of the design rules. In another example the satisfactory threshold may be limits associated with each of the feature’s shape, size, relative position, etc. For example, the shape of the assist features should be rectilinear, the size should be ±0.2 nm of a desired CD of the feature, the relative position of the assist feature should be within ±0.5 nm with respect to a main feature or target feature, or other design rules. In addition, the satisfactory threshold includes a sharpness threshold. The present disclosure is not limited to a particular design rule.

The generator model is trained to improve the generated characteristic pattern so that the discriminator model may not distinguish the generated characteristic pattern as fake.

In an embodiment, a cost function for the discriminator is a function of how often it correctly identifies the input image. A different cost function for the generator has two parts: (i) a metric of how often a generated EFM image is labeled “real” by the discriminator, and (ii) another metric related to an image fidelity of the generated EFM. For example, the metric for image fidelity can be a measure of how much the generated EFM differs from an input CTM, or a measurement of lithography performance from a lithography simulation using the generated EFM. In an embodiment, an EFM image may be very sharp and CTM may be very blurry. So a direct difference between pixel values may not be taken. In an embodiment, the comparison includes applying a transfer function (e.g., a low pass filter or blurring) to transform the EFM image to a blurry image before comparing with the CTM.

In an embodiment, the generator model and the discriminator model may be two separate convolutional neural networks (DCNNs). After training, the generator model can be used to generate a characteristic pattern using any CTM as input. Thus, the extraction process of e.g., SRAFs is fast and less time consuming compared to exiting methods. Also, as the generated characteristic pattern closely follows the CTM, a lithographic performance e.g., EPE, yield can be significantly improved using such characteristic pattern compared to existing mask design methods.

In FIG. 4, the training process includes a generator model 405, a continuous transmission mask image CTM1, a discriminator model 410, and reference characteristic patterns EFMs. The generator model 405 receives CTM1 as input and generates a characteristic pattern EFM1 as output. The discriminator model 410 receives the generated EFM1, and one or more reference EFMs as inputs and the discriminator model 410 distinguishes each of the reference EFMs and the generated EFM1 as fake or real. In an embodiment, the generated EFM1 is distinguished as real and the reference EFMs can be distinguished as fake. This is undesired result indicating a model parameter or a plurality of model parameters (e.g., weights and biases) of the discriminator model should be adjusted so that the generated EFM1 is labelled fake and a plurality of reference EFMs are labelled real. Also, the when the discriminator model 410 distinguishes that the generated EFM1 is fake, a model parameter of the generator model may be adjusted to improve the quality of EFM1 such that EFM1 may be distinguished as real.

In an embodiment, the adjusting of the model parameter (s) of the generator model 405 is based on a first cost function and the adjusting of the model parameter(s) of the discriminator model 410 is based on a second cost function. For example, the first cost function is a function of (i) a first probability that the discriminator model distinguishes the generated EFM1 as fake (or real), and (ii) a metric between the generated EFM1 and the input CTM1. In an embodiment, the first probability is minimize. However, if the first probability is that the discriminator model distinguishes the generated EFM1 as real, then the first probability is maximized. Furthermore, the metric between EFM1 and CTM1 is minimized. Hence, depending on the configuration of the first cost function, the adjustment of the parameters of the generator model may be to minimize the entire first cost function, or maximize the first probability and minimize the metric between EFM1 and CTM1.

Furthermore, for example, the second cost function is another function of (i) the first probability that the generated EFM1 is distinguished as fake and (ii) a second probability that the reference characteristic pattern EFMs is distinguished as real. In an embodiment, according to a configuration of the second cost function, the parameters of model 410 are adjusted so that the second cost function is maximized. After the end of the training process, the generated model 405 can be referred as the trained generator model 405' and the discriminator model 410 can be referred as the trained discriminator model 410'. Detailed steps or procedures related to the training process of FIG. 4 are further discussed with respect to a flow chart of FIGS. 9A and 9B herein.

In the present disclosure, the generator model (G) used herein (e.g., 415 in FIG. 4) may be associated with the first cost function. The first cost function enables tuning of parameters of the generator model (e.g., 415) such that the first cost function is improved (e.g., the terms of the first cost function are maximized or minimized, as discussed above). In an embodiment, the first cost function comprises a first log-likelihood term that determines a probability that the characteristic pattern is a fake image given the input vector.

An example of the first cost function (e.g., $L_G$) can be expressed by equation 1 below:

$$L_G=E[\log P(S=\text{fake}|X_{fake})] \quad (1)$$

In above equation 1, a log likelihood of conditional probability is computed. In the equation, S refers to a generated characteristic pattern (e.g., EFM1) assigned as fake by the discriminator model and $X_{fake}$ is an output i.e., a fake image of the generator model. Thus, in an embodiment, the training method minimizes the first cost function ($L_G$). Consequently, the generator model will generate fake images (e.g., the characteristic pattern images) such that the conditional probability that the discriminator model will realize the fake image as fake is low. In other words, the generator model will progressively generate more and more realistic images or patterns.

In an embodiment, the first cost function (e.g., $L_G$) may further includes a term f(CTM−TF(EFM)), which is a function of a metric between an input CTM and EFM generated by the machine learning model (e.g., the generator model 405 described herein). For example, the function includes transforming (e.g., via a transfer function TF) the EFM to a CTM style image. Then a sum of a mean squared of the differences between the transformed EFM and CTM is determined, where each difference is a difference between pixel values at a given pixel of the CTM and the transformed EFM. In an embodiment, the difference between the CTM and EFM may not be included, for example, in two stage GAN flow (e.g., in FIGS. 5A and 5B).

In an embodiment, the discriminator model (D) may be a convolutional neural networks. The discriminator model (D) receives as input—a real image (e.g., the reference characteristic pattern) and the fake image (e.g., the generated characteristic pattern), and outputs a probability that the input is a fake image or a real image. The probability can be expressed as P(S|X)=D(X). In other words, if the fake image generated by the generator model is not good (i.e., not close to a real image), then the discriminator model will output a low probability value (e.g., less than 50%) to the input image. This indicates the input image is a fake image. As the training progresses, the generator model produces images closely resembling a real image, thus, eventually the discriminator model may not be able to distinguish whether the input image is a fake image or a real image.

An example of the second cost function (e.g., $L_D$) can be expressed by equation 2 below:

$$L_D=E[\log P(S=\text{real}|X_{real})]+E[\log P(S=\text{fake}|X_{fake})] \quad (2)$$

In above equation, a log likelihood of conditional probability is computed. In the equation, S refers to a source assignment as real given that the input is a real image $X_{real}$, and a source assignment as fake given that the input image is a fake image $X_{fake}$ e.g., a fake image of the generator model. In an embodiment, the training method maximizes the second cost function (eq. 2). Consequently, the discriminator model progressively gets better at distinguishing a real image from a fake image.

Thus, the generator model and the discriminator model are trained simultaneously, such that the discriminator model provides a feedback to the generator model about quality of the fake image (i.e., how closely the fake image resembles the real image). Further, the quality of the fake image gets better; the discriminator model needs to get better at distinguishing the fake image from the real image. The goal is to train the models until they do not improve each other. For example, if values of respective cost functions do not change substantially over further iterations, the models do not improve each other, hence considered as trained models.

Figure 5A:
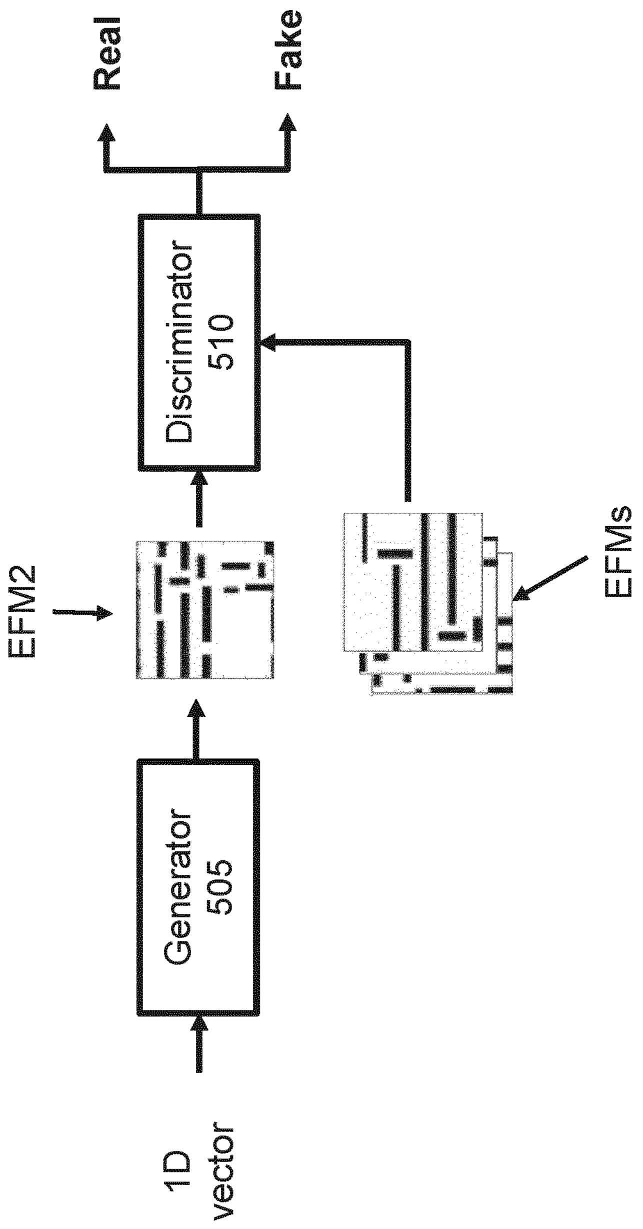
FIGS. 5A and 5B are a block diagrams of a two-stage training process using a GAN training process for training a machine learning model that generates characteristic pattern using CTM as input, according to an embodiment.
Figure 5B:
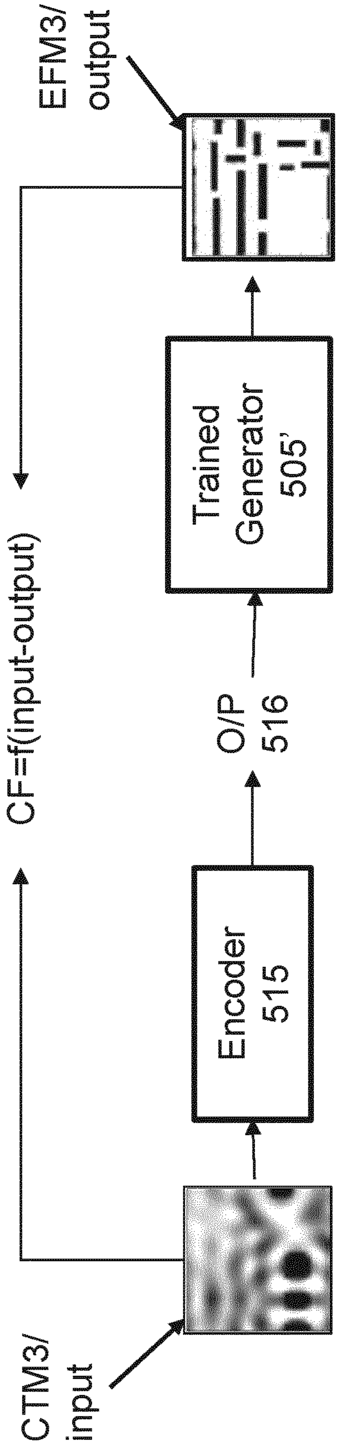

FIGS. 5A and 5B is a block diagram of a two-stage training process that seeks to improve the generated characteristic pattern or an image thereof as compared to the GAN training process of FIG. 4. The two-stage training process is divided into a two stage GAN flow. The first stage, shown in FIG. 5A, trains a generator model. The trained generator model is further used to train another machine learning model in the second stage, shown in FIG. 5B.

The purpose of the first stage, in FIG. 5A, is to train a generator network 505 to generate a characteristic pattern (e.g., represented as EFM images) from a one dimensional (1D) vector as an input vector. For example, the 1D vector acts as a compressed form of a characteristic pattern EFM2. The generator model 505 is trained to decompress the 1D vector into the characteristic pattern that not only obeys the MRC but also satisfies a sharpness threshold of the features.

The generator model 505 is trained simultaneously with a discriminator model 510 that distinguishes an input pattern as real or fake. The training of the generator model 505 and the discriminator model 510 is similar to the GAN architecture discussed above. For example, the generator model 505 employs a first cost function including equation 1 and the discriminator model 510 employs a second cost function including equation 2 discussed herein. In this case, the input to the generator model 505 can be a random noise vector, e.g., a 1D noise vector. Then, the generator model 505 then generates a characteristic pattern (e.g., EFM2). The characteristic pattern EFM2, and a reference characteristic pattern or a plurality of reference characteristic patterns EFMs are sent as inputs to the discriminator model 510. The discriminator model 510 distinguishes the inputs as real or fake. Then, based on the probabilities calculated, for example, according to equations 1 and 2, model parameters of the generator model 505 and the discriminator model 510 are adjusted until the first and the second cost function values do not change much e.g., remain within a threshold range such as with 0% to 10% compared to a previous iteration values.

After training, the trained generator model 505' is considered to be trained to generate a characteristic pattern from any 1D vector such that the generated characteristic pattern follows the design rules (e.g., MRC) as well as the meets the sharpness threshold of the features therein. This trained generator model 505' is further used in the second stage of the training process, in FIG. 5B.

In the second stage, in FIG. 5B, the training process uses the trained generator model 505' as the pretrained pattern library. In other words, model parameters (e.g., weights and biases) of the trained generator model 505' are fixed and do not change during the training process in the second stage. In the second stage, an encoder model 515 is trained to convert an input CTM (e.g., CTM3) to a 1D vector (e.g., output 516). This 1D vector (e.g., the output 516) is sent as an input to the trained generator model 505'. Based on the input, the trained generator model 505' outputs a characteristic pattern EFM3. This characteristic pattern EFM3 is further compared to the input CTM3. Based on the comparison, model parameters of the encoder model 515 are adjusted so that, e.g., a difference function or a cost function CF between the EFM3 and CTM3 is reduced. In an embodiment, the cost function CF is minimized.

In an embodiment, the output (e.g., EFM3) of the trained generator model 505' can be passed through a low pass filter to eliminate unwanted components such as high frequency data noise in the output (e.g., EFM3) thereby the difference between EFM3 and CTM3 will be independent of high frequency data. Hence, a more accurate comparison between EFM and CTM can be performed thereby resulting in more accurate trained encoder model 515'. In an embodiment, the low pass filter may also be applied to the output of other training flows herein, e.g., FIG. 4.

In an embodiment, the characteristic pattern EFM3 is used in a lithographic simulation to determine a performance metric (e.g., EPE or yield). Based on the performance metric, the model parameters of the encoder model 515 may be adjusted so that the performance metric is within an acceptable range.

After the training process is complete, e.g., after a predetermined number of iterations or when the cost function CF or the performance metric does not improve by much e.g., remain within a threshold range such as with 0% to 10% compared to a previous iteration values. Then, a trained encoder model 515' can be used to convert any CTM image to a 1D vector which is further used to generate, via the trained generator model 505', a characteristic pattern. The generated characteristic pattern (e.g., EFM3) is then considered to follow the design rules as well as meets the sharpness threshold of the features therein.

In an embodiment, the encoder model 515/515' that compresses an input CTM image to a 1D vector can be another machine learning model (e.g., DCNN, CNN). Accordingly, the adjusted model parameters will be weights and biases of e.g., the CNN. Detailed steps or procedures related to the training process of FIGS. 5A and 5B are further discussed with respect to a flow chart of FIGS. 10A and 10B herein.

Figure 6A:
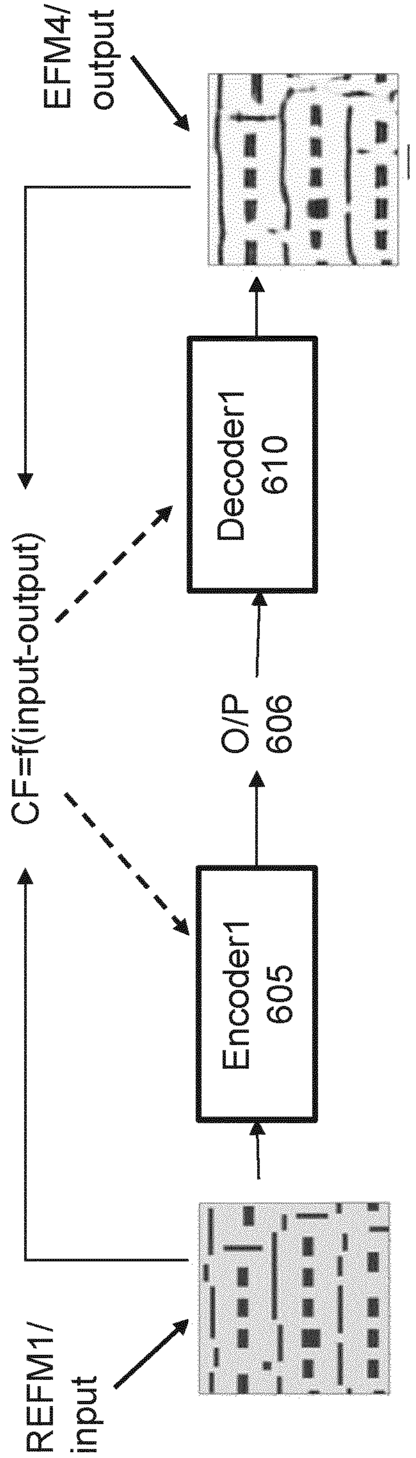
FIGS. 6A and 6B are block diagrams of yet another training process to develop a machine learning model that generates characteristic pattern using CTM as input, according to an embodiment.
Figure 6B:
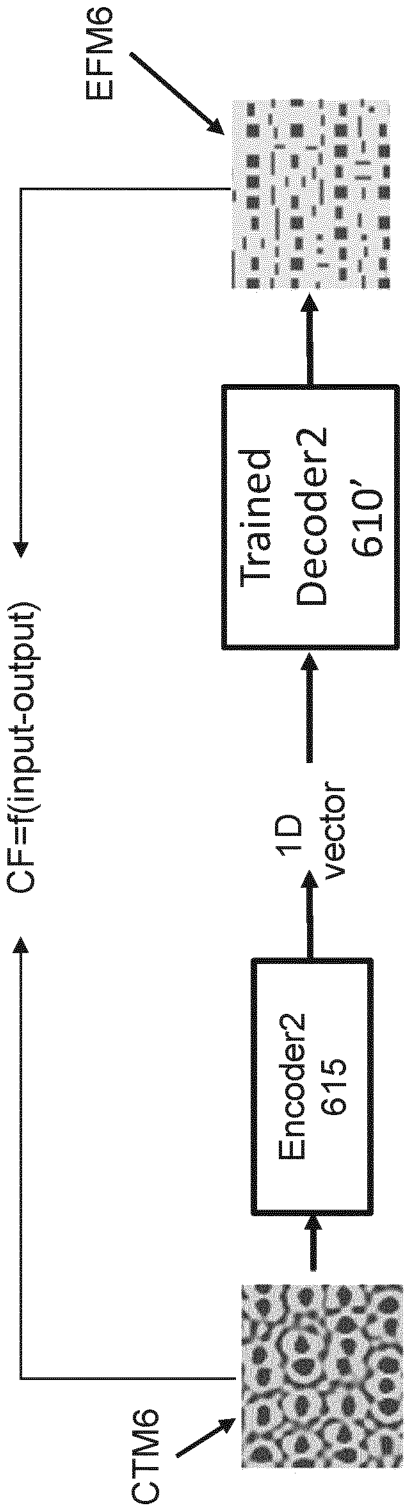

FIGS. 6A and 6B are block diagrams of yet another training process to develop a machine learning model that generates characteristic pattern using CTM as input. This training process can be considered as a modified version of the two stage GAN flow illustrate in FIGS. 5A and 5B. The training in FIGS. 6A and 6B, changes the first stage of the GAN to an autoencoder. This provides an alternative method for implementing the regularization cost term that ensures that the characteristic pattern satisfies design rules as well as meets the sharpness threshold of the features therein. The autoencoder training process involves three models namely: a first encoder model 605, a first decoder model 610, and a second encoder model 615.

FIG. 6A is a first stage of the training process, where the first encoder model 605 and the first decoder model 610 are trained. The first encoder model 605 receives a reference characteristic pattern REFM1 as input and generates a vector e.g., a 1D vector as output. The reference characteristic pattern REFM1 satisfies the design rules as well as meets the sharpness threshold of the features therein. The output 606 (e.g., 1D vector) is a compressed form of the EFM input.

The output 606 of the first encoder model 605 is sent to the first decoder model 610 as an input. The first decoder model 610 is configured to generate a characteristic pattern EFM4 as an output. In other words, the first decoder model tries to reconstruct the original reference characteristic pattern (e.g., REFM1). The cost function for the first stage of the training includes a cost function which can be a function of a difference between the inputted reference characteristic pattern (e.g., REFM1) and the reconstructed EFM (e.g., EFM4). During the training process, model parameters of each of the first encoder model 605 and the first decoder model 610 are adjusted such that the cost function (e.g., difference between REFM1 and EFM4) is reduced. In an embodiment, the cost function is minimized. Thereby, the trained decoder model 610' will ensure a close match between the reference characteristic pattern and the generated characteristic pattern (e.g., EFM4). In other words, the trained decoder model 610' ensures that for an input vector (e.g., 1D vector), it generates a characteristic pattern that satisfies the design rules as well as meets the sharpness threshold of the features therein. In an embodiment, the decoder model (or pattern library) can be trained using a variational autoencoder, where the encoder outputs a 1D vector related to the CTM, as well as a statistical vector. In an embodiment, the training involves minimizing a statistical metric of the statistical vector as well. For example, the statistical metric is Kullback-Leibler (KL) divergence is a measure of how far the distributions are from a unit Gaussian distribution. In an embodiment, minimizing the KL divergence makes the distributions closer to a unit Gaussian distribution.

Referring to FIG. 6B, the trained decoder model 610' is used in a second stage of the training process as a pretrained pattern library. This second stage is the similar to a second stage for the two stage GAN flow discussed with respect to FIG. 5B.

For example, according to FIG. 6B, model parameters (e.g., weights and biases) of the trained first decoder model 610' are fixed and do not change during the training process in the second stage. In the second stage, the second encoder model 615 is trained to convert an input CTM (e.g., CTM6) to a compressed vector e.g., 1D vector. This 1D vector is sent as an input to the trained decoder model 610'. Based on the input, the trained decoder model 610' outputs a characteristic pattern EFM6. This characteristic pattern EFM6 is further compared to the input CTM6. Based on the comparison, model parameters of the second encoder model 615 are adjusted so that, e.g., a difference function or a cost function CF between the EFM6 and CTM6 is reduced. In an embodiment, the cost function CF is minimized.

In an embodiment, the characteristic pattern EFM6 is used in a lithographic simulation to determine a performance metric (e.g., EPE or yield). Based on the performance metric, the model parameters of the second encoder model 615 may be adjusted so that the performance metric is within an acceptable range.

In an embodiment, the training methods discussed above can be further modified to train based on a target mask image (e.g., design layout or target pattern) as input. This flow can be a modified form of the modified GAN flow (e.g., FIG. 4), the two stage GAN flow (e.g., FIGS. 5A and 5B), or the two stage autoencoder flow (e.g., FIGS. 6A and 6B). In the further modified flow, the input is a target pattern, an image of the target pattern, or a mask image obtained after convolution of the target pattern with an optical transfer function related to projection system of a lithographic apparatus. The cost function can be a performance metric obtained using a lithography simulation (e.g., FIG. 3) using the characteristic pattern. This removes the need for a CTM generation step.

Figure 7A:
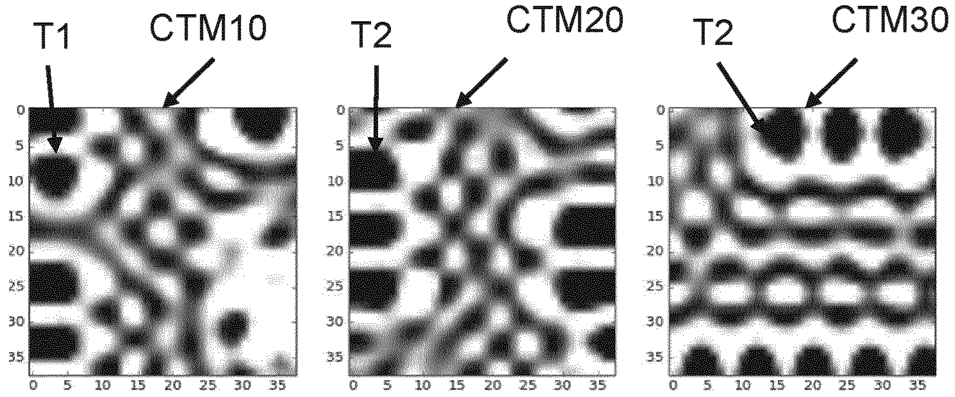
FIG. 7A illustrates examples of continuous transmission mask includes target features, according to an embodiment.
Figure 7B:
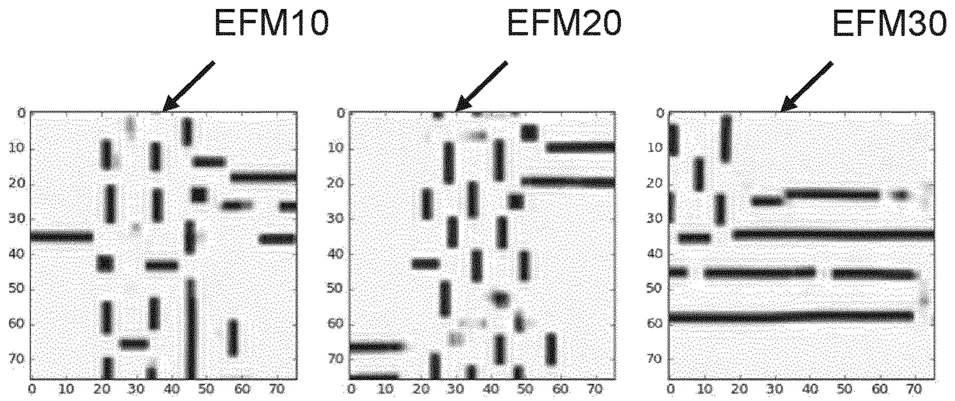
FIG. 7B illustrates example images of characteristic patterns generated using the trained models (e.g., of FIGS. 5, 5A and 5B, and 6A and 6B, according to an embodiment.
Figure 7C:
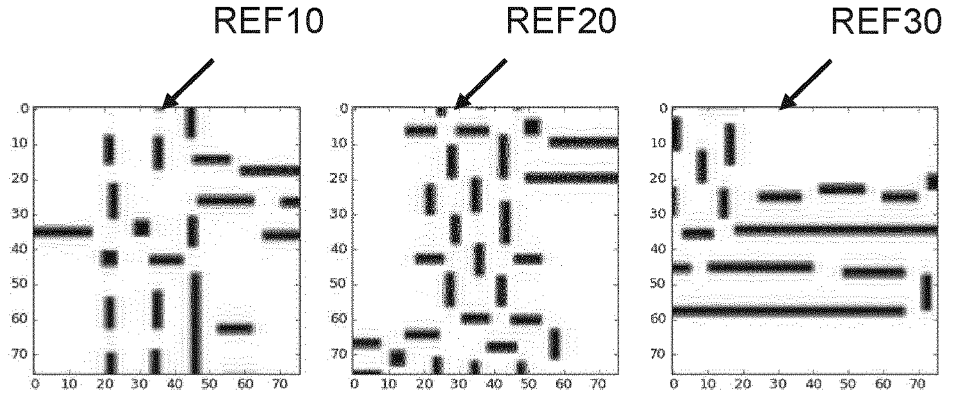
FIG. 7C illustrates example reference characteristic pattern that meet design rules, according to an embodiment.

FIGS. 7A-7C illustrate example CTMs including target patterns, generated characteristic pattern, and reference characteristic pattern. In FIG. 7A, continuous transmission mask CTM10, CTM20, and CTM30 includes target features. The target features are relatively larger and darkest portion within the grey scale image. For example, CTM10 includes a target feature T1, CTM20 includes a target feature T2, and CTM30 includes a target feature T3. In an embodiment, the CTM can be generated using existing software employing inverse lithographic technique to generate mask patterns. For example, CTM optimization process are discussed in detail in U.S. patent publication US20170038692A1, which is incorporated herein in its entirety by reference, that describes different flows of optimization for lithographic processes. However, determining such CTM (or CTM+) is computationally time consuming, and extracting features (e.g., SRAFs) may be difficult or require specialized algorithms. Furthermore, the extract features are curvilinear in shape, some of these curvilinear shapes may be difficult to manufacture or may not be manufactured due to limitation in mask manufacturing.

FIG. 7B illustrates example images of characteristic patterns generated using the trained models of the present disclosure. For example, executing a trained generator model 405' (or trained encoder model 515' or the second trained encoder model 615') using CTM10 as an input image, the characteristic pattern EFM10 is generated. Similarly, characteristic patterns EFM20 and EFM30 can be generated using CTM20 and CTM30 respectively. In the present example, the characteristic patterns EFM10, EFM20 and EFM30 show only SRAFs that are rectilinear (e.g., step-like) or rectangular in shape and target patterns are omitted. These characteristic patterns EFM10-EFM30 satisfy design rules and have predominantly rectangular or rectilinear (e.g., step-like) shapes that are easy to extract and manufacture using e.g., e-beam lithography. However, these examples do not limit the scope of the present disclosure. In an embodiment, the characteristic patterns may also include target features e.g., corresponding to T1, T2, and T3.

FIG. 7C illustrates example reference characteristic pattern that meets design rules or meet a satisfactory threshold related to manufacturing of the mask pattern. For example, the reference characteristic patterns REF10, REF20, and REF30 correspond to CTM10, CTM20, and CTM30, respectively. These reference patterns are considered ideal as they satisfy more than 90% to 100% of the design rules. Comparing the reference characteristic patterns (in FIG. 7C) and the characteristic patterns (in FIG. 7B) shows that the trained model e.g., 405' can generate characteristic patterns which are very similar to reference patterns. In other words the trained models (e.g., 405', 515' and 615') generate characteristic patterns that meet the design rules or a satisfactory threshold related to manufacturing of the mask pattern as well as meet the sharpness threshold.

Figure 7D:
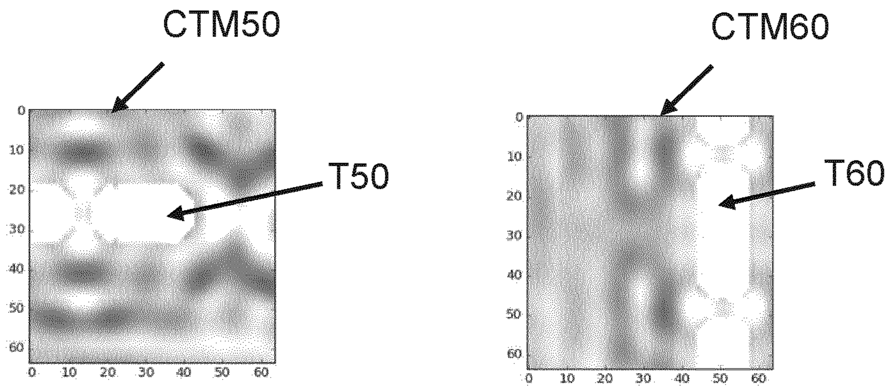
FIG. 7D illustrates examples of continuous transmission mask omitting/removing target features, according to an embodiment.
Figure 7E:
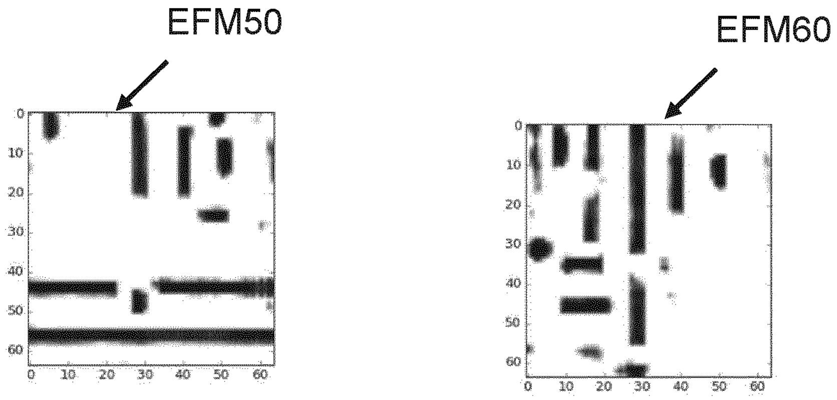
FIG. 7E illustrates example characteristic pattern generated via machine learning model using the CTM of FIG. 7D, according to an embodiment.

FIG. 7D illustrate another example of CTMs with portions corresponding to target features are removed and used during the training process (e.g., in FIGS. 4-6B and 8A-11B). For example, CTM50 does not include portion corresponding to a target feature T50 and CTM60 does not include portion corresponding to a target feature T60. FIG. 7E illustrates example characteristic patterns generated by a trained model. For example, characteristic patterns EFM50 and EFM60 that satisfy design rules and have predominantly rectangular or rectilinear (e.g., step-like) shapes that are easy to extract and manufacture using e.g., e-beam lithography.

Figure 8A:
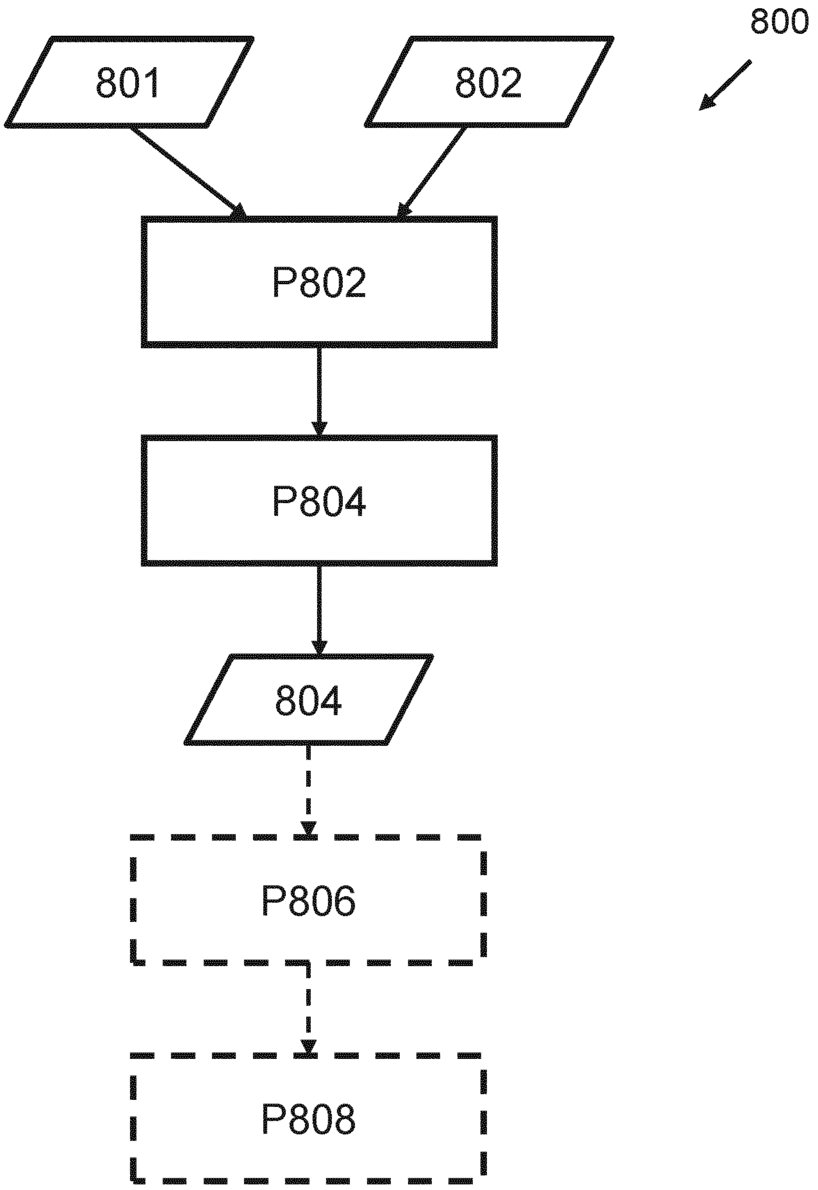
FIGS. 8A and 8B are flow charts related to a method for training a machine learning model configured to generate a characteristic pattern for a mask pattern, according to an embodiment.

FIG. 8A is a flow chart of a method 800 training a machine learning model configured to generate a characteristic pattern for a mask pattern. The characteristic pattern includes easy to extract features (e.g., rectilinear assist features) that satisfy the design rules (e.g., MRC) and meets a sharpness threshold of related to features therein. For example, a simple edge detection algorithm can be employed to extract contours of features in the characteristic pattern. As the patterns are easy to extract compared to e.g., CTM, substantial computation time and resources are saved. Also, as the patterns are easy to manufacture compared to the CTM, the implementation is faster. In addition, the machine learning model is trained to generate the characteristic pattern that are similar to CTM. Hence, characteristic patterns can meet lithographic printing performance. The method 800 includes procedures P802 and P804 discussed as follows.

Procedure P802 includes obtaining (i) a reference characteristic pattern 801 that meets a satisfactory threshold related to manufacturing of the mask pattern and a sharpness threshold related to the features therein, and (ii) a continuous transmission mask 802 (CTM) for use in generating the mask pattern. In an embodiment, meeting the satisfactory threshold is also referred as satisfying of the design rules and/or limitations related to manufacturing of the mask pattern.

In an embodiment, the reference characteristic pattern 801 may include a plurality of reference characteristic patterns, each reference characteristic pattern meeting the satisfactory threshold related to MRC as well as a sharpness threshold of the features therein. In an embodiment, the reference characteristic pattern 801 is a pixelated image generated based on design rules related to manufacturing of the mask pattern. Additional discussion of the reference characteristic pattern 801 is available throughout the disclosure. Example reference characteristic patterns are represented by images in FIGS. 4, 5A, 6A, and 7C.

As discussed herein, the CTM 802 is an image generated by simulating an optical proximity correction process using a target pattern to be printed on a substrate. Examples of CTM 802 are represented as images shown in FIGS. 4, 5B, 6B, 7A and 7D.

Figure 8B:
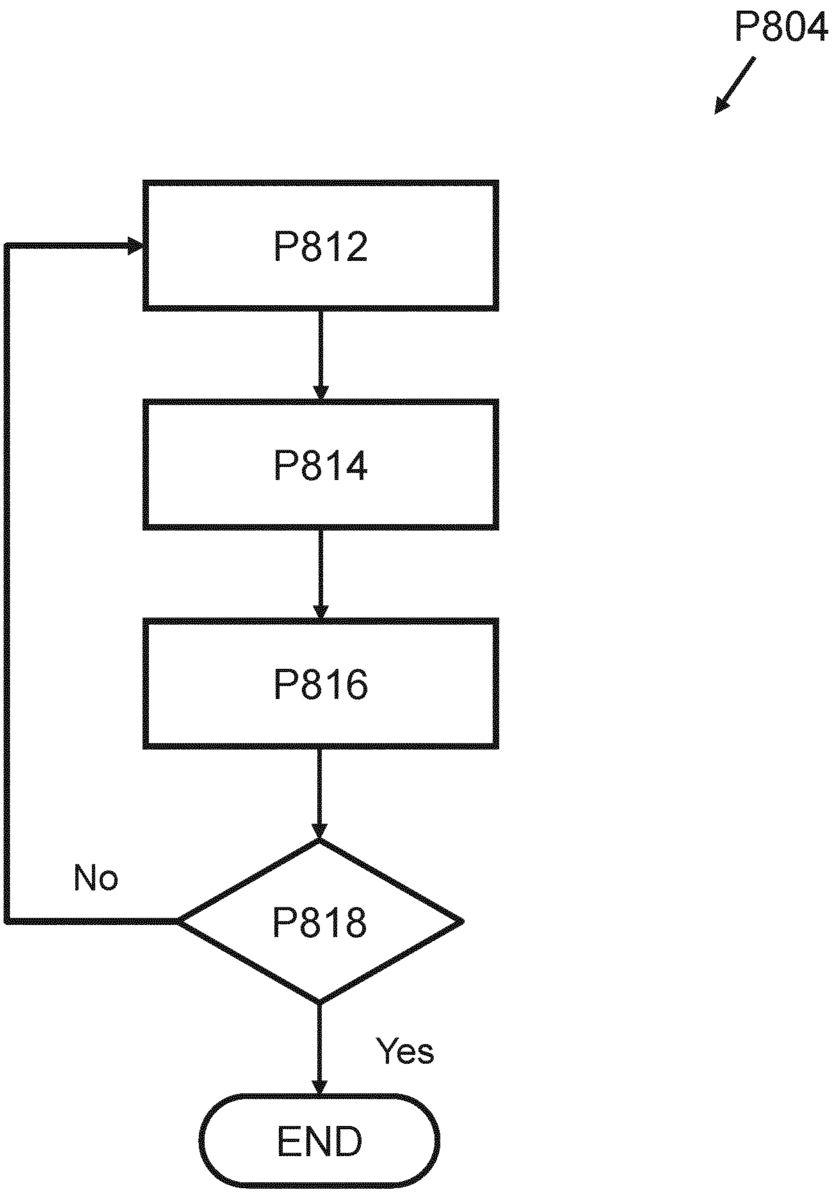

Procedure P804 includes training, based on the reference characteristic pattern 801 and the CTM 802, the machine learning model such that a first metric between the characteristic pattern and the CTM 802, and a second metric between the characteristic pattern and the reference characteristic pattern 801 is reduced. As discussed earlier, the first metric includes transforming the characteristic pattern and then taking a difference between the transformed characteristic pattern and the CTM 802. Also, as mentioned earlier, the second metric compares the style (e.g., sharpness) of the characteristic pattern with the style of the reference characteristic pattern. In an embodiment, the differences are minimized. FIG. 8B is an example flow chart of the training process P804. The end of training process P804 results in a trained machine learning model 804 that can be used to generate a characteristic pattern from any CTM 802 image. Example characteristic pattern generated by a trained model are represented as images in FIGS. 7B and 7D.

Referring to FIG. 8B, the training process P804 is an iterative process including following procedures. Procedure P812 includes executing, the machine learning model using the CTM 802, to output characteristic pattern. In a first iteration, the outputted characteristic pattern may not satisfy the design rules or meet the satisfactory threshold, nor meet the sharpness threshold of the features therein. Hence, further iteration may be performed where one or more model parameters are modified so that the machine learning model outputs progressive better results compared to previous iteration. Procedure P814 includes determining the first metric calculated as e.g., a difference between the outputted characteristic pattern and the CTM 802, and the second metric between the outputted characteristic pattern and the reference characteristic pattern 801. Procedure P816 includes adjusting the machine learning model such that the first metric, the second metric, and/or a combination thereof is reduced. Procedure P818 includes determining whether the first metric, the second metric, and/or the combination thereof is minimized. Responsive to the difference not minimized, procedures P812, P814, P816 and P818 may be repeated until the difference is minimized. In an embodiment, a stopping criteria may be a pre-defined number of iteration or comparing results of prior iteration to determine if the present results have improved. If minimum to no further improvement is observed then iterations may stop. After the end of training process, the machine learning model may be considered as a trained model 804.

In an embodiment, the method 800 optionally includes following procedures procedure P806 includes determining, via executing the trained machine learning model using a given CTM (e.g., CTM 802, CTM10, CTM20, CTM30, CTM50, CTM60 discussed herein), a characteristic pattern; and procedure P808 includes extracting contours of the characteristic pattern, the contours being used for generating the mask pattern.

In an embodiment, the CTM 802 is generated such that an EPE associated with critical features of a target layout (e.g., memory circuit) is minimized. In an embodiment, the CTM 802 is generated such that yield of the patterning process is maximized. Hence, when such CTM 802 is used for a training model configured to generate characteristic pattern, several lithographic performance characteristic can be transferred to the generated characteristic patterns (e.g., via the trained model having particular weights per the training process). In addition, the training is based on the reference characteristic pattern 801 that satisfy design rules as well as meets the sharpness threshold of the features therein. Hence, limitations related to design rules are also met by the characteristic pattern. Thereby the characteristic pattern can provide not only improved lithographic performance but also are manufacturable using mask manufacturing process such as e-beam lithography.

As discussed earlier, the characteristic pattern may include sub-resolution features placed around a target feature of the target pattern. In an embodiment, the sub-resolution features are rectilinear in shape.

The extracted features can be used to make a mask pattern. The mask pattern can be further sent for mask manufacturing, e.g., the mask pattern is printed on a mask. The mask can be further employed in a lithographic apparatus, where the mask pattern is transferred to a substrate to form a target pattern.

Figure 9A:
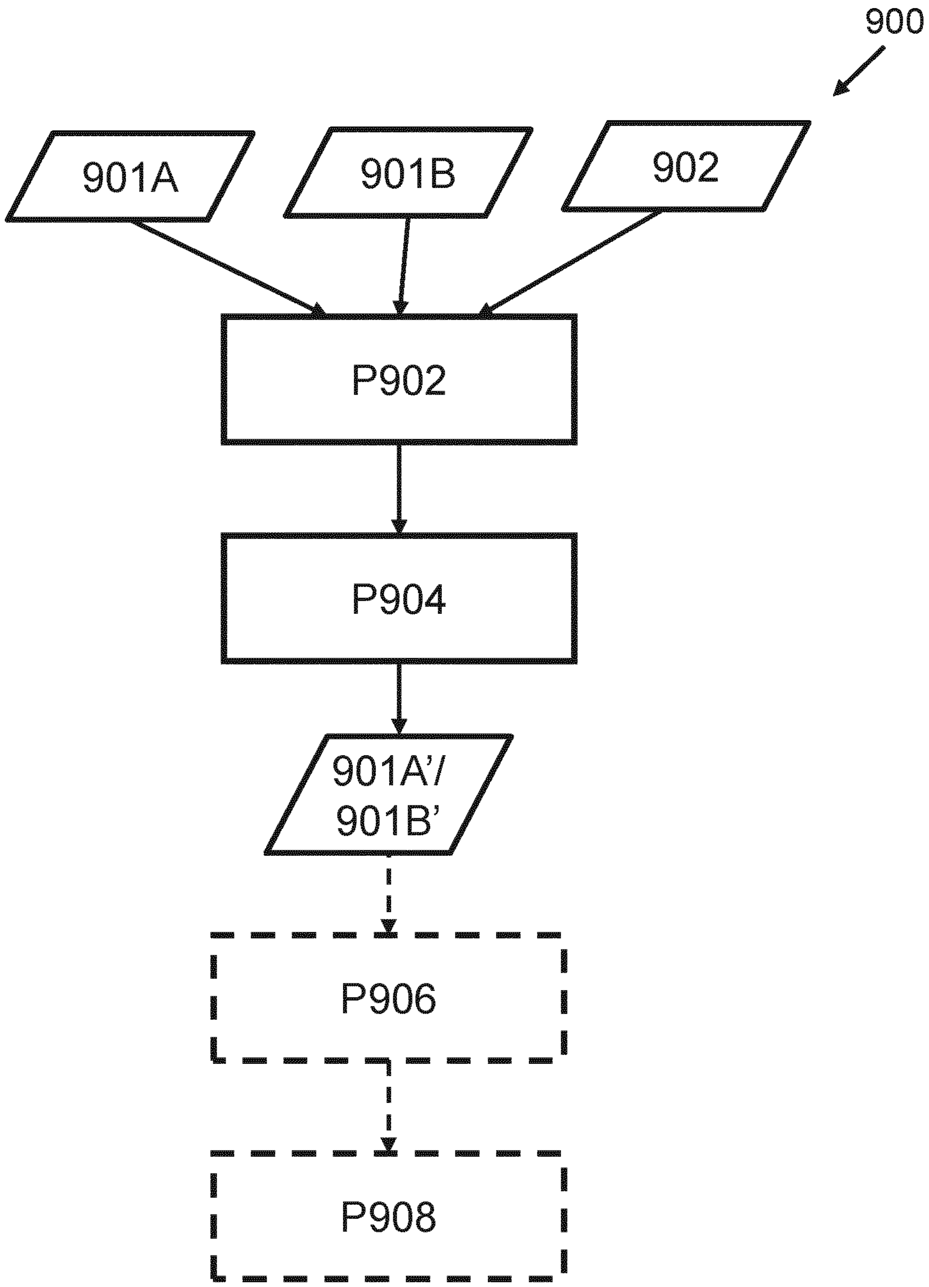
FIGS. 9A and 9B are flow charts related to another method for training a machine learning model configured to generate a characteristic pattern for a mask pattern, according to an embodiment.

FIG. 9A is a flow chart of a method 900 for training a machine learning model 901 configured to generate a characteristic pattern for a mask pattern. The method 900 is an example implementing of functions of the block diagram of FIG. 4 discussed earlier. The method 900 includes procedures P902 and P904 discussed as follows.

Procedure P902 includes obtaining the machine learning model 901 comprising a generator model 901A and a discriminator model 901B. In an embodiment, the generator model 901A (an example of the generator model 405 in FIG. 4) is configured to generate the characteristic pattern from a continuous transmission mask (CTM). In an embodiment, the discriminator model 901B (an example of the discriminator model 410 in FIG. 4) is configured to determine whether an input pattern meets a satisfactory threshold related to the manufacturing of the mask pattern, (e.g., whether the input pattern is real or fake) as well as a sharpness threshold of the features therein. For example, the discriminator model 901B labels the input pattern as real or fake. In an embodiment, the generator model 901A and the discriminator model 901B are convolutional neural networks (CNN) and the model parameters of the CNN are weights and biases of one or more layers of the CNN.

The procedure P902 further includes obtaining a reference characteristic pattern 902 that meets the satisfactory threshold related to manufacturing of the mask pattern as well as the sharpness threshold. As mentioned earlier, the reference pattern can be generated using a software implementing heuristic rules or design rules. In an embodiment, a trained discriminator model 901B' determines the reference pattern as real.

Figure 9B:
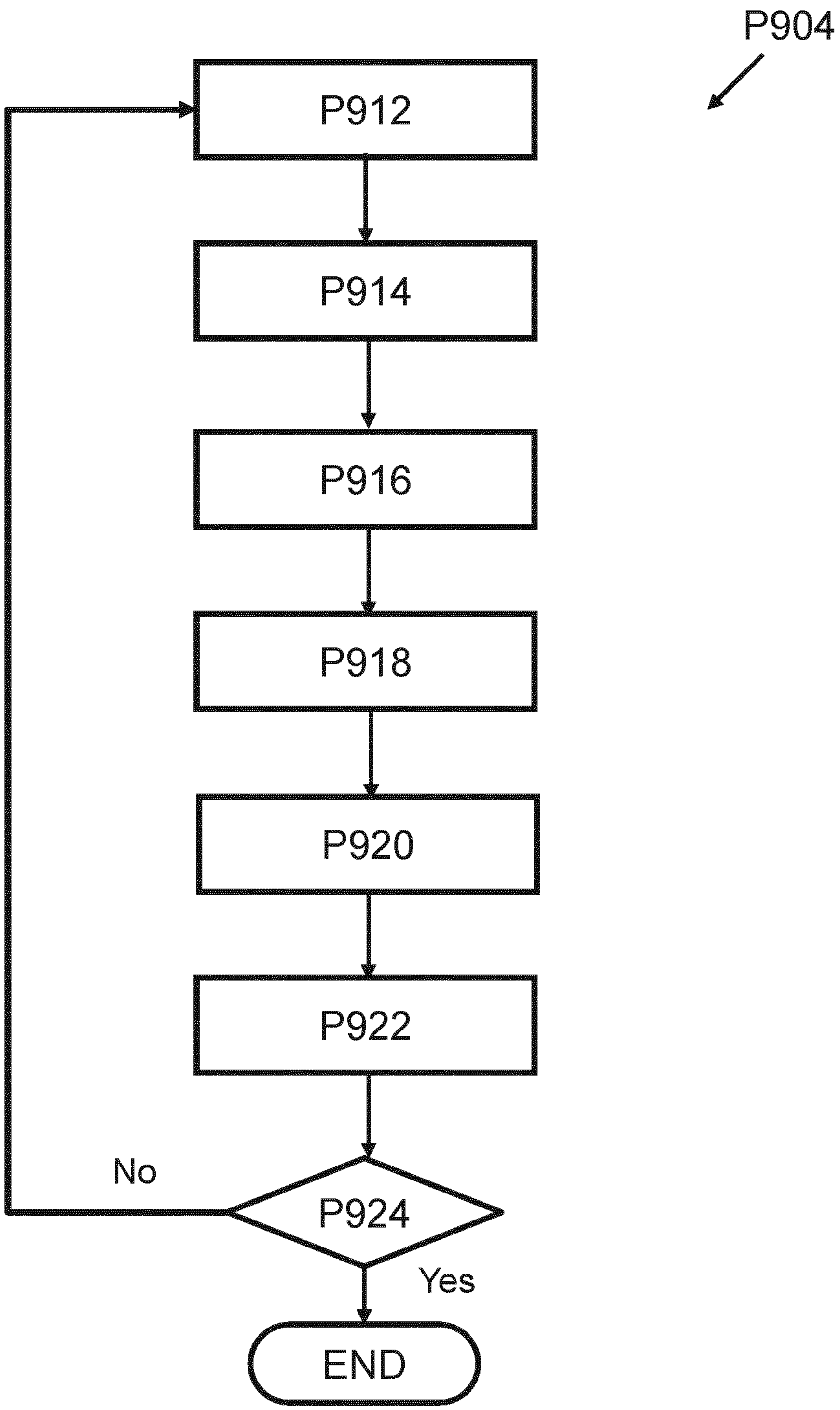

Procedure P904 includes training the generator model 901A and the discriminator model 901B in a cooperative manner such that: (i) the generator model 901A generates the characteristic pattern using the CTM, and the discriminator model 901B determines that the characteristic pattern as meeting the satisfactory threshold (e.g., real) and the reference characteristic pattern 902 as being meeting the satisfactory threshold (e.g., real), and (ii) a difference between the generated characteristic pattern and the CTM is reduced. In an embodiment, the differences are minimized. FIG. 9B is an example flow chart of the training process P904.

Referring to FIG. 9B, the training process P904 of the generator model 901A and the discriminator model 901B is an iterative process. For example, the training process P904 includes following procedures. Procedure P912 includes generating, via executing the generator model 901A using the CTM, the characteristic pattern. Procedure P914 includes evaluating a first cost function associated with the generator model 901A, the first cost function being a function of (i) a first probability that the discriminator model 901B determines whether the characteristic pattern as not meeting the satisfactory threshold (e.g., fake), and (ii) the metric between the generated characteristic pattern and the CTM. Procedure P916 includes determining, via the discriminator model 901B, the characteristic pattern and the reference characteristic pattern 902 as meeting the satisfactory threshold (e.g., real) or not meeting the satisfactory threshold (e.g., fake). Procedure P918 includes evaluating a second cost function associated with the discriminator model 901B, the second cost function being another function of (i) the first probability that the characteristic pattern is determined as not meeting the satisfactory threshold (e.g., fake) and (ii) a second probability that the reference characteristic pattern 902 is determined as meeting the satisfactory threshold (e.g., real). Procedure P920 includes adjusting first parameters of the generator model 901A to (i) increase the first probability that the discriminator model 901B determines the characteristic pattern as meeting the satisfactory threshold (e.g., real), and (ii) reduce the difference between the generated characteristic pattern and the CTM and/or reduce a performance metric associated with a patterning process. Procedure P922 includes adjusting second parameters of the discriminator model 901B to improve the second cost function. Procedure P24 determining whether the first cost function, the second cost function, and/or the combination thereof is optimized (e.g., meeting a low threshold or a high threshold value). As discussed earlier, optimizing depends on the configuration of the terms in the first cost function and the second cost function. In an embodiment, both the terms of the first cost function are minimized (or breaches a low threshold). In an embodiment, a first term is maximized (e.g., breaches a high threshold) and the second term is minimized. In an embodiment, the second cost function is maximized (e.g., breaches a high threshold).

In an embodiment, responsive to the cost functions not optimized, procedures P912, P914, P916, P918, P920, P922, and P924 may be repeated until the cost functions are optimized e.g., minimized. In an embodiment, stopping criteria may be a pre-defined number of iteration or comparing results of prior iteration to determine if the present results have improved. If minimum to no further improvement is observed then iterations may stop. After the end of training process, the machine learning model may be considered as a trained model 901' including the trained generate model 901A' and the trained generator model 901B' are obtained.

In an embodiment, the first cost function includes the performance metric associated with the patterning process. In an embodiment, the generator model 901A is trained to minimize the performance metric, wherein the performance metric is determined via simulating the patterning process using a mask pattern, the mask pattern including one or more features extracted from the characteristic pattern. In an embodiment, the performance metric is at least one of: a critical dimension error related to a feature to be printed on a substrate; an edge placement error between the feature to be printed on the substrate and a target feature; or a pattern placement error between two or more features to be printed on the substrate.

In an embodiment, the first cost function comprises a first log-likelihood term that determines the first probability that the characteristic pattern is a fake. For example, the first cost function includes the loss function $L_G$ i.e., equation 1 discussed herein. In an embodiment, the adjusting of parameters of the generator model 901A is such that the first log-likelihood term is minimized.

In an embodiment, the second cost function includes a second log-likelihood term that determines the first probability that the characteristic pattern is fake and the second probability that the reference characteristic pattern is real. For example, the second cost function includes the loss function $L_D$ (i.e., equation 2) discussed herein. In an embodiment, the adjusting of the second model parameters is such that the second log-likelihood term is maximized.

In an embodiment, the characteristic pattern includes features having substantially rectilinear pattern. In an embodiment, the method 900 further includes generating, via executing the trained generator model 901A using a given CTM, sub-resolution features for a mask pattern, wherein the sub-resolution features have rectilinear shapes.

In an embodiment, the method 900 may optionally include procedures P906 and P908 describes as follows. Procedures P906 includes outputting, via executing the trained generator model 901A' using a given CTM, a characteristic pattern. The outputted characteristic pattern meeting the satisfactory threshold associated with manufacturing of the mask pattern. Procedures P908 extracting contours of the outputted characteristic pattern, the contours being used for generating the mask pattern. In an embodiment, the outputted characteristic pattern comprises sub-resolution features that are rectilinear in shape.

As discussed earlier, in an embodiment, the CTM is generated such that an EPE associated with critical features of a target layout (e.g., memory circuit) is minimized. In an embodiment, the CTM is generated such that yield of the patterning process is maximized. Hence, when such CTM is used for a training model configured to generate characteristic pattern, several lithographic performance characteristics can be transferred to the generated characteristic patterns (e.g., via the trained model having particular weights per the training process). In addition, the training is based on the reference characteristic pattern 902 that satisfy design rules. Hence, limitations related to design rules are also met by the characteristic pattern. Thereby the characteristic pattern can provide not only improved lithographic performance but also are manufacturable using mask manufacturing process such as e-beam lithography.

Figure 10A:
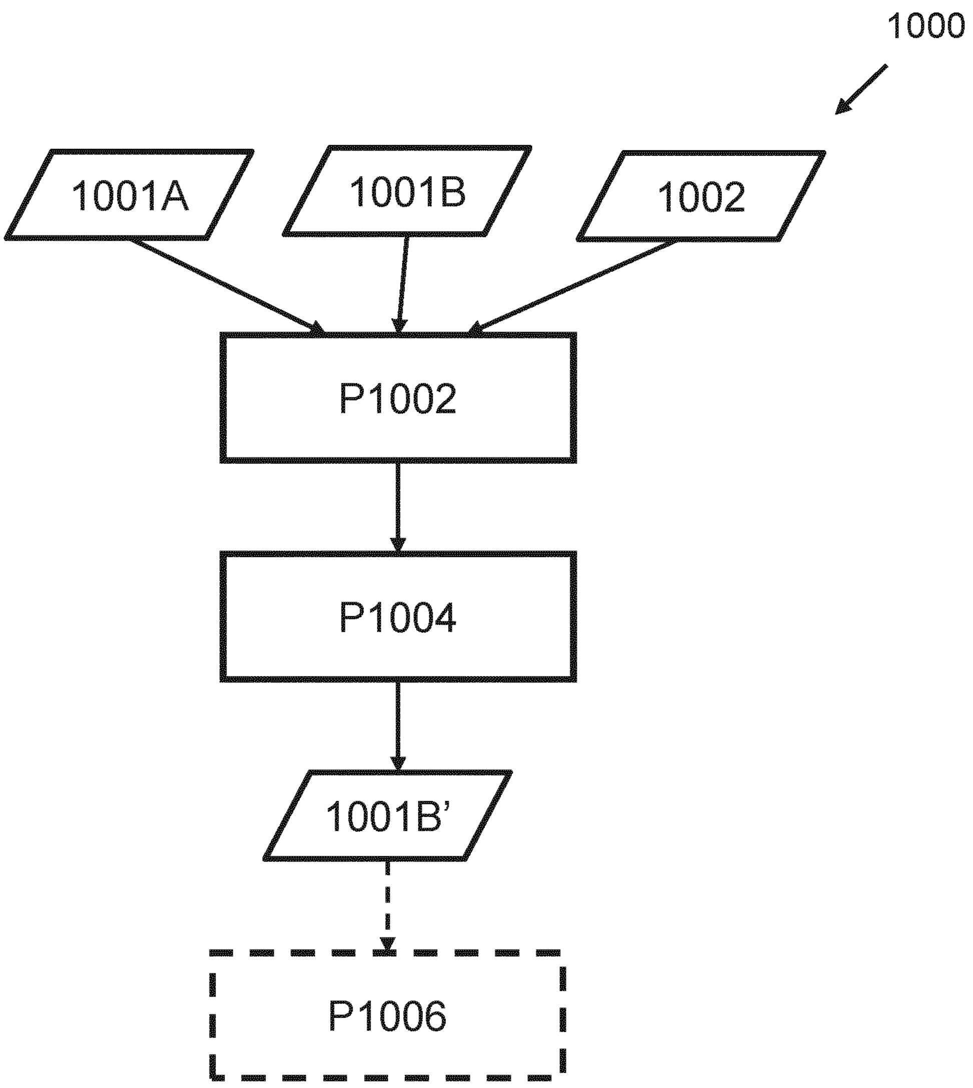
FIGS. 10A, 10B and 10C are flow charts related to yet another method for training a machine learning model configured to generate a characteristic pattern for a mask pattern, according to an embodiment.

FIG. 10A is a flow chart of a method 1000 for training a machine learning model configured to generate a characteristic pattern for a mask pattern. The method 1000 is an example implementing of functions discussed with respect to the block diagram of FIGS. 5A and 5B discussed earlier. The method 1000 includes procedures P1002 and P1004 discussed as follows.

Procedure P1002 includes obtaining the machine learning model 1001 that includes a trained generator model 1001A and an encoder model 1001B. In an embodiment, the trained generator model 1001A (an example of the generator model 515 in FIG. 5B) is configured to generate the characteristic pattern from an input vector. In an embodiment, the encoder model 1001B (an example of the generator model 505' in FIGS. 5A and 5B) is used for converting an input image (e.g., CTM 1002) to a one dimensional (1D) vector. An example of 1D vector can be a compressed form of CTM 1002 image represented in a single column of a matrix. The procedure P1002 also includes obtaining of a continuous transmission mask 1002 (CTM) used for generating the mask pattern. The CTM 1002 can be obtained as discussed herein, e.g., inverse lithographic, using OPC software.

Procedure P1002 includes training the encoder model 1001B in cooperation with the trained generator model 1001A. In an embodiment, an example the training process P1002 is further illustrated in FIG. 10B.

Figure 10B:
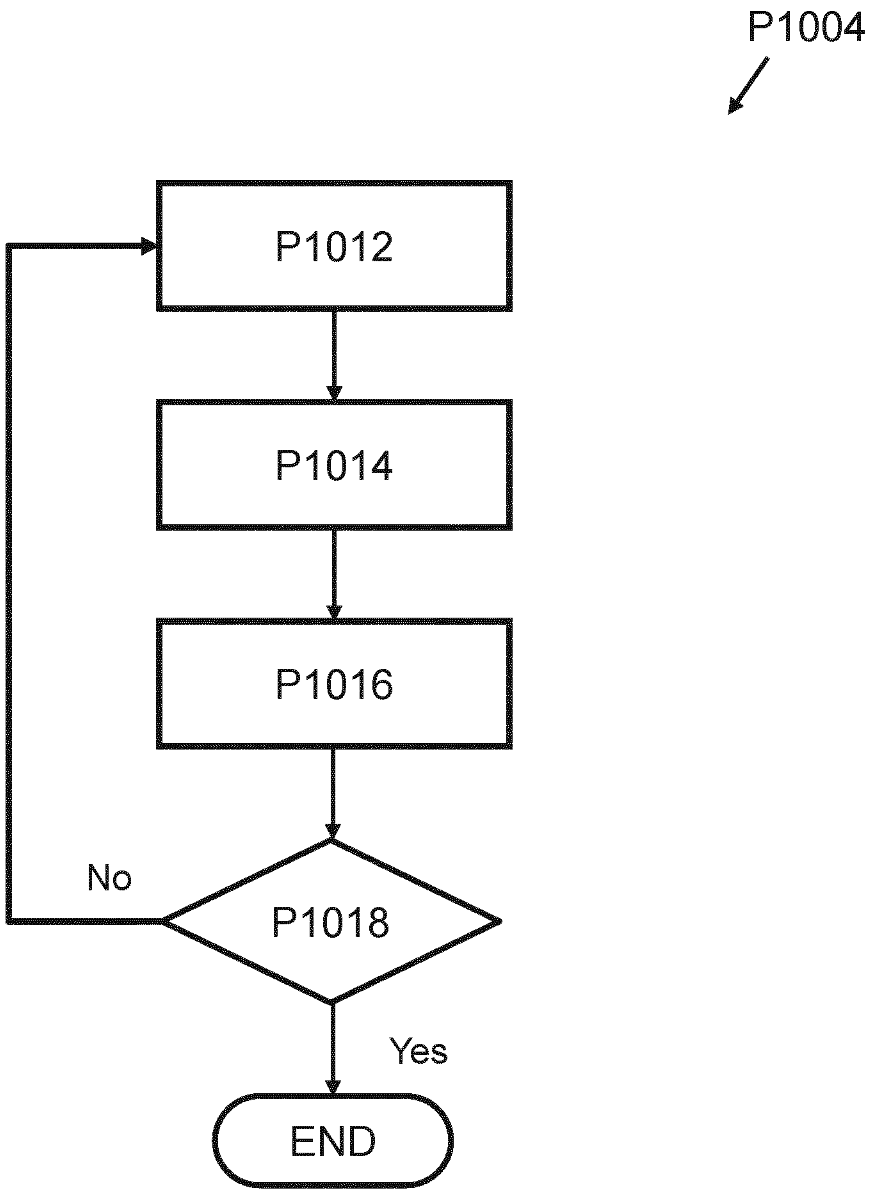

Referring to FIG. 10B, procedure P1012 includes executing the encoder model 1001B using the CTM 1002 as the input image to generate the 1D vector. Procedure P1014 includes executing the trained generator model 1001A using the generated 1D vector as the input vector to generate the characteristic pattern; and Procedure P1016 includes adjusting model parameters of the encoder model 1001B such that a difference between the generated characteristic pattern and the CTM 1002 is reduced. In an embodiment, the difference is minimized. In an embodiment, the adjusting of the model parameters of the encoder model 1001B such that a performance metric associated with a patterning process is reduced in a successive iteration.

In an embodiment, the encoder model 1001B is trained to minimize the performance metric, wherein the performance metric is determined via simulating the patterning process using a mask pattern, the mask pattern including one or more features extracted from the characteristic pattern. In an embodiment, the performance metric is at least one of: a critical dimension error related to a feature to be printed on a substrate; an edge placement error between the feature to be printed on the substrate and a target feature; or a pattern placement error between two or more features to be printed on the substrate.

Further, in procedure P1018, a determination can be made whether the difference or the performance metric is minimized. In an embodiment, responsive to the difference or the performance metric not minimized, procedures P1012, P1014, P1016, and P1018 may be repeated until the difference is minimized. In an embodiment, stopping criteria may be a pre-defined number of iteration or comparing results of prior iteration to determine if the present results have improved. If minimum to no further improvement is observed then iterations may stop. After the end of training process, the machine learning model may be considered as the trained encoder model 1001B'.

In an embodiment, the procedures P1001 of obtaining of the trained generator model 1001A an iterative process. An example flow chart of the obtaining the trained generator model 1001A is provided in FIG. 10C.

Figure 10C:
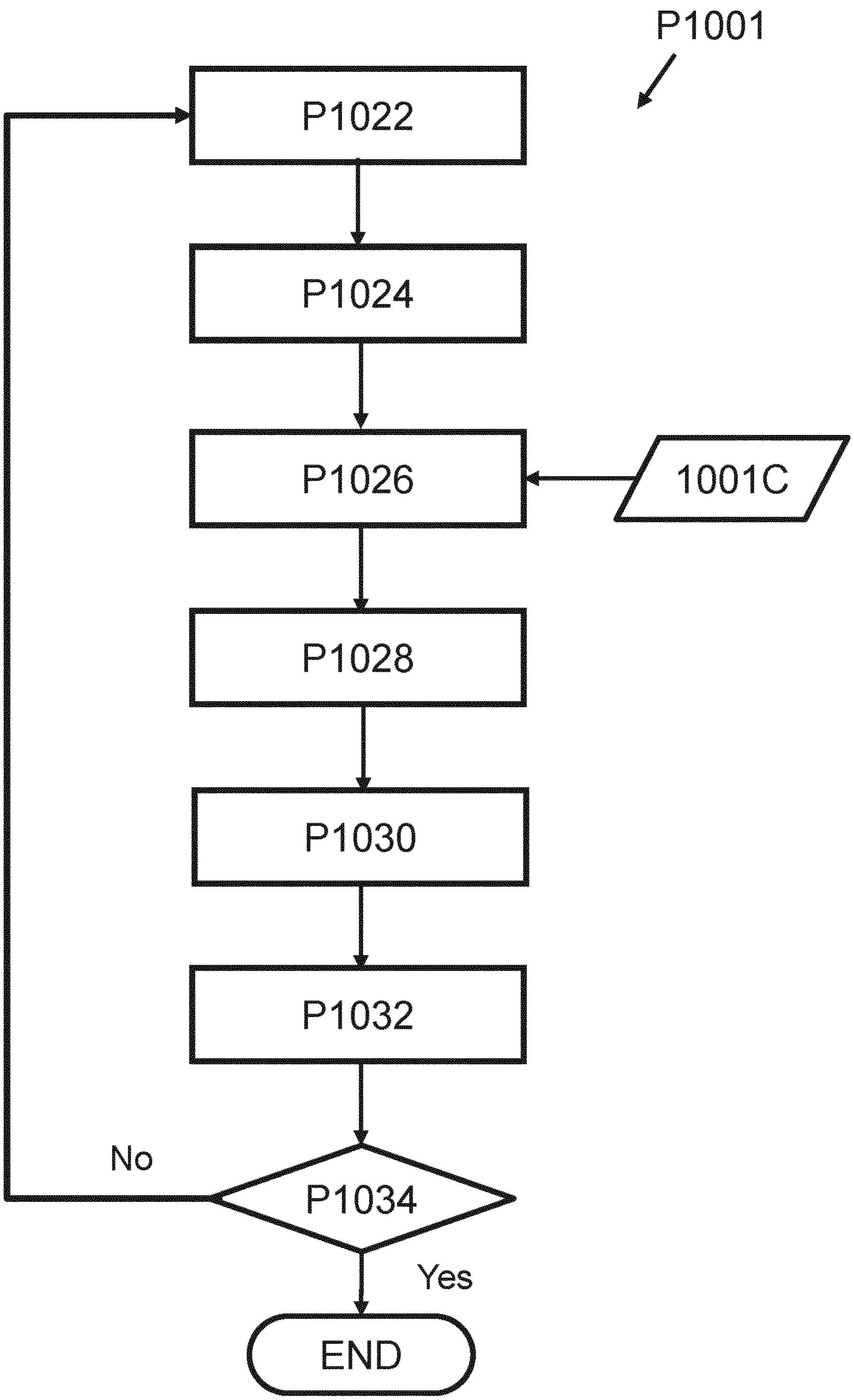

In FIG. 10C, procedure P1022 includes generating, via executing a generator model using a 1D noise vector as the input vector, the characteristic pattern. Procedure P1024 includes evaluating a first cost function associated with the generator model, the first cost function being a function of a first probability that the discriminator model determines the characteristic pattern as meeting a satisfactory threshold related to manufacturing of the mask pattern (e.g., real). Procedure P1026 includes determining, via a discriminator model 1001C, the characteristic pattern and a reference characteristic pattern as meeting the satisfactory threshold (e.g., fake) or not meeting the satisfactory threshold. In an embodiment, the discriminator model 1001C (an example of 510 in FIG. 5A) is configured to determine whether an input pattern meets the satisfactory threshold (e.g., real) or does not meet the satisfactory threshold (e.g., fake). In an embodiment, the reference pattern characteristic considered as meeting the satisfactory threshold (e.g., real). For example, the reference characteristic pattern satisfies more than 90% to 100% of the design rules. Ideally, the reference pattern should satisfy 100% of the design rules. Procedure P1028 includes evaluating a second cost function associated with the discriminator model 1001C, the second cost function being a function of (i) the first probability that the characteristic pattern is determined as not meeting the satisfactory threshold (e.g., fake) and (ii) a second probability that the reference characteristic function is determined as meeting the satisfactory threshold (e.g., real). Procedure P1030 includes adjusting first parameters of the generator model to (i) increase the first probability that the discriminator model 1001C determines the characteristic pattern as meeting the satisfactory threshold (e.g., real) including a sharpness threshold. Procedure P1032 includes adjusting second parameters of the discriminator model 1001C to maximize the second cost function.

In an embodiment, the first probability and the second probability can be computed using equation 1 and 2 discussed above.

In an embodiment, responsive to the cost function(s) not optimized, procedures P1022, P1024, P1026, P1028, P1030, P1032, and P1034 may be repeated until the cost function(s) is optimized. In an embodiment, stopping criteria may be a pre-defined number of iteration or comparing results of prior iteration to determine if the present results have improved. If minimum to no further improvement is observed then iterations may stop. After the end of training process, the machine learning model may be considered as the trained encoder model 1001B'.

Referring back to FIG. 10A, the method 1000 may optionally include procedure P1006. The procedure P1006 includes generating, via executing the trained machine learning model using a given CTM 1002, the characteristic pattern including sub-resolution features for a mask pattern, wherein the sub-resolution features have rectilinear shapes. In an embodiment, the trained machine learning model comprises the trained encoder model 1001B that converts the given CTM 1002 to the 1D vector and the trained generator model 1001A converts the 1D vector to the characteristic pattern. Optionally, an extraction process may be implemented to extract contours from the characteristic patterns as discussed in FIGS. 8A and 9A.

As discussed earlier, in an embodiment, the encoder model 1001B, the trained generator model 1001A, the discriminator model 1001C, or a combination thereof are convolutional neural networks (CNN).

The method 1000 have same advantages related to the characteristic patterns as discussed in other methods 800 and 900. In addition, the method 1000 provides an additional computational advantage. For example, since 1D vectors are used for training and further for generating the characteristic patterns, the computation time is relatively faster than using a grey scale CTM image.

Figure 11A:
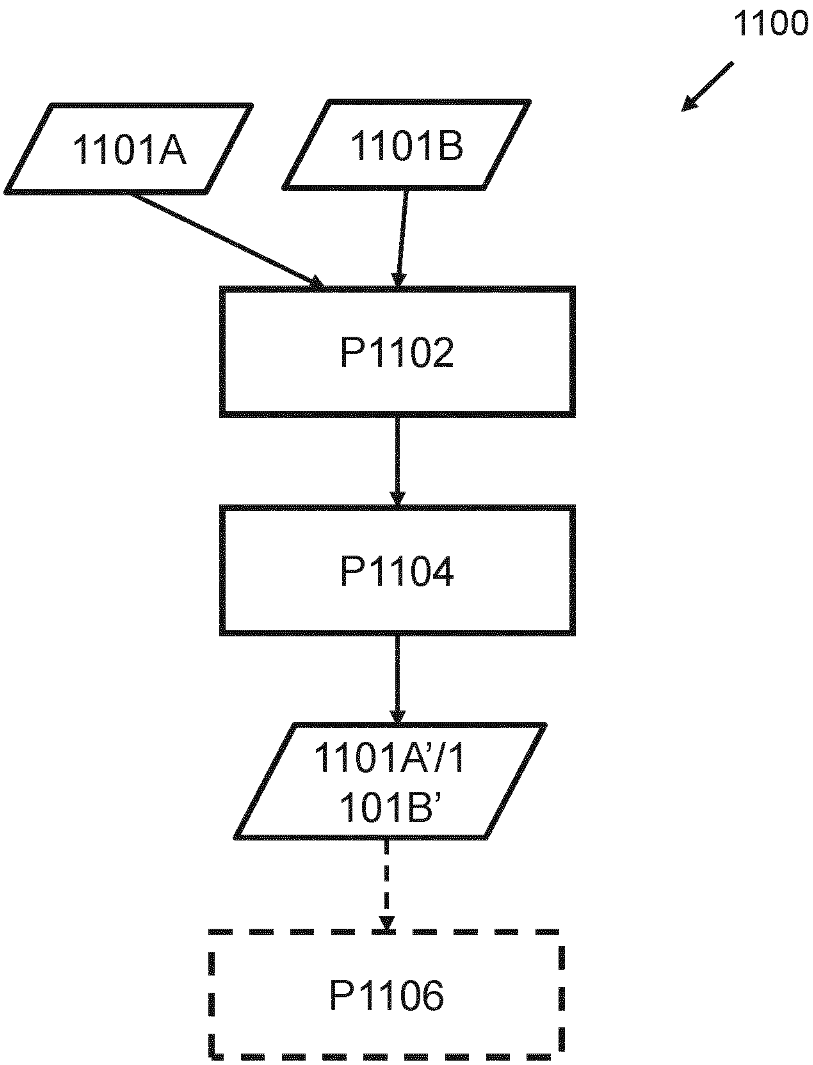
FIGS. 11A, 11B and 11C are flow charts related yet another method for training a machine learning model configured to generate a characteristic pattern for a mask pattern, according to an embodiment.

FIG. 11A is flow chart of a method 1100 for training a machine learning model configured to generate a characteristic pattern for a mask. The method 1100 is an example implementing of functions discussed with respect to the block diagram of FIGS. 6A and 6B discussed earlier. The method 1100 includes procedures P1102 and P1104 discussed as follows.

Procedure P1102 includes obtaining the machine learning model including (i) an encoder model 1101A for converting an input image to a one dimensional (1D) vector and (ii) a decoder model 1101B configured to generate the characteristic pattern from an input vector.

Procedure P1104 includes training the encoder model 1101A in cooperation with the decoder model 1101B. An example flow chart of the procedure P1104 is shown in FIG. 11B includes following procedures.

Figure 11B:
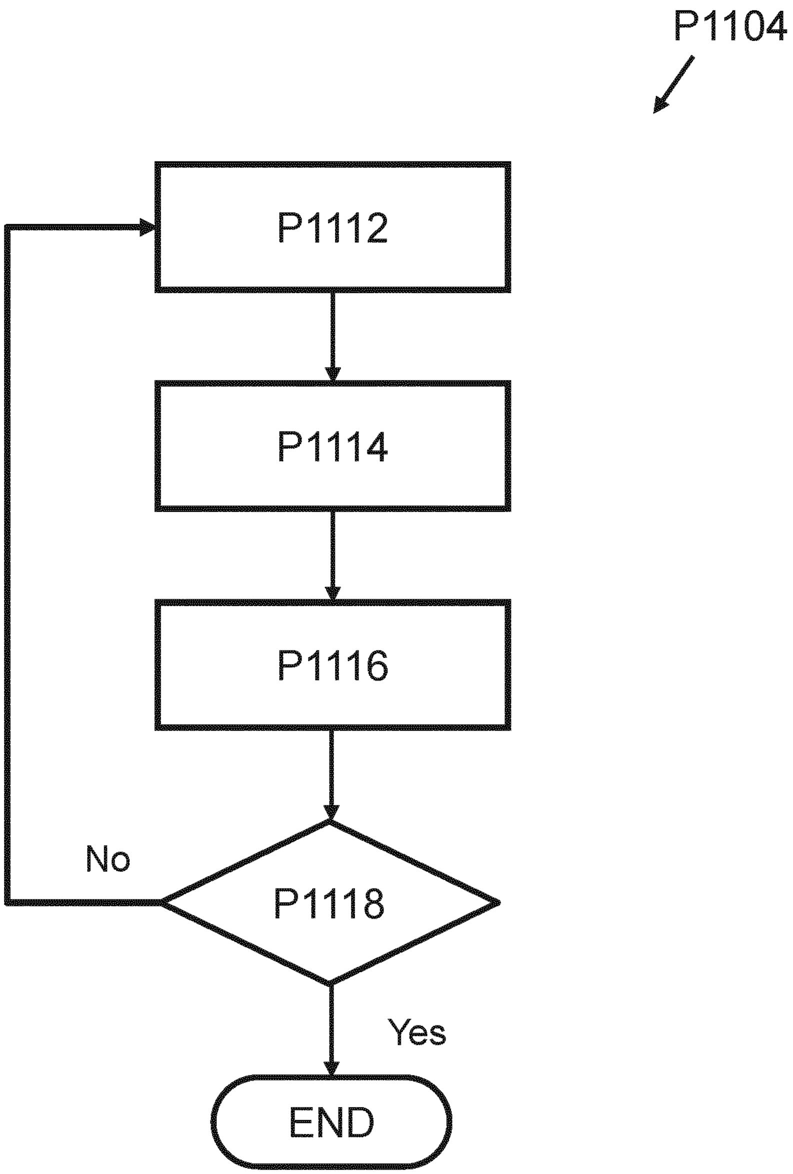

Referring to FIG. 11B, procedure P1112 includes executing the encoder model 1101A using a reference characteristic pattern as the input image to generate the 1D vector, wherein the reference characteristic pattern meets a satisfactory threshold associated with manufacturing of the mask pattern. Procedure P1114 includes executing the decoder model 1101B using the generated 1D vector as the input vector to generate the characteristic pattern. Procedure P1116 includes adjusting model parameters of the encoder model 1101A and the decoder model 1101B such that a difference between the generated characteristic pattern and the reference characteristic pattern is reduced. In an embodiment, procedure P1118 determines whether the difference is minimized.

In an embodiment, responsive to the difference not minimized, procedures P1112, P1114, P1116, and P1118 may be repeated until the difference is minimized. In an embodiment, stopping criteria may be a pre-defined number of iteration or comparing results of prior iteration to determine if the present results have improved. If minimum to no further improvement is observed then iterations may stop. After the end of training process, the trained encoder model 1101A' and the trained decoder model 1101B' are obtained.

In an embodiment, the method 1100 further includes a second stage of training. The second stage includes a method 1120. An example flow chart of the method 1120 is show in FIG. 11C and described as follows.

Figure 11C:
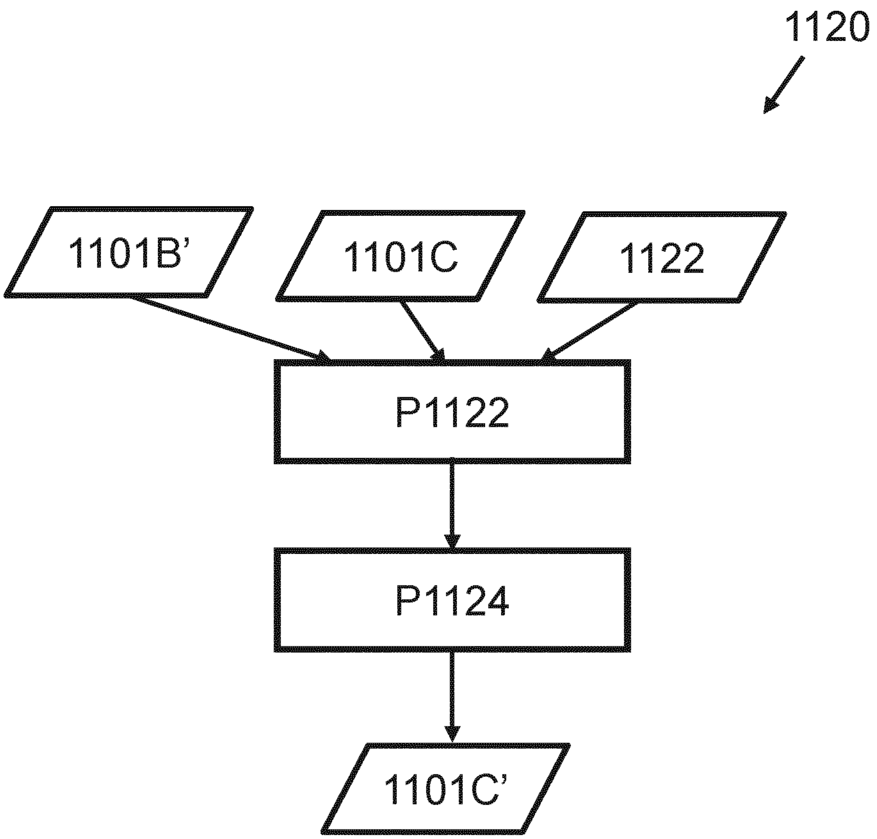

In FIG. 11C, procedure P1122 includes obtaining a second encoder model 1101C configured to convert a continuous transmission mask (CTM) used for generating the mask pattern to the 1D vector. Procedure P1124 includes training the second encoder model 1101C in cooperation with the trained decoder model 1101B'.

In an embodiment, the training procedure P1124 includes executing the second encoder model 1101C using the CTM as the input image to generate the 1D vector; executing the trained decoder model 1101B' using the generated 1D vector as the input vector to generate the characteristic pattern; and adjusting model parameters of the second encoder model 1101C such that another difference between the generated characteristic pattern and the CTM is reduced, and/or a performance metric associated with a patterning process is reduced. In an embodiment, the adjusting continues until the difference or the performance metric is minimized.

In an embodiment, the encoder model 1101A and the decoder model 1101B are trained to minimize the performance metric. As discussed herein, the performance metric is determined via simulating the patterning process using a mask pattern, the mask pattern including one or more features extracted from the characteristic pattern. In an embodiment, the performance metric is at least one of: a critical dimension error related to a feature to be printed on a substrate; an edge placement error between the feature to be printed on the substrate and a target feature; or a pattern placement error between two or more features to be printed on the substrate.

Referring back to FIG. 11A, the method 1100 may optionally include procedure P1106. The procedure P1106 includes generating, via executing the trained second encoder model 1101C' and the trained decoder model 1001B' using a given CTM, the characteristic pattern including sub-resolution features for a mask pattern. For example, the sub-resolution features have rectilinear shapes.

In an embodiment, the encoder model 1101A, the second encoder model 1101C, the decoder model, or a combination thereof are convolutional neural networks (CNN).

The method 1100 have same advantages related to the characteristic patterns as discussed in other methods 800 and 900. In addition, the generator model may be trained relatively easily compared to methods 800 and 900 as 1D vectors are used. Particularly, the generator loss function is less complex, so the training process of method 1100 is less likely to fall into a local optimum.

As mentioned earlier, any of the above methods may be modified to be trained using a target mask pattern. For example, a method of training a machine learning model includes obtaining (i) a reference characteristic pattern (e.g., as discussed above) that meets a satisfactory threshold related to manufacturing of the mask pattern and a sharpness threshold, and (ii) a target pattern; and training, based on the reference characteristic pattern and the target, the machine learning model such that a metric between the characteristic pattern and the reference characteristic pattern is reduced and a performance metric associated with a patterning process is reduced.

In an embodiment, the machine learning model is trained to minimize the performance metric, wherein the performance metric is determined via simulating the patterning process using a mask pattern, the mask pattern including one or more features extracted from the characteristic pattern. The simulation outputs a simulated pattern corresponding to the mask pattern including the features (e.g., SRAFs) extracted from the characteristic pattern.

In an embodiment, the performance metric is at least one of: a critical dimension error between a simulated feature and a target feature of the target pattern to be printed on a substrate; an edge placement error between the simulated feature and the target feature to be printed on the substrate; or a pattern placement error between two or more simulated features to be printed features on the substrate.

Furthermore, there is provided a method of training a machine learning model configured to generate a characteristic pattern for a mask pattern. The method includes obtaining (a) the machine learning model comprising: (i) a trained generator model configured to generate the characteristic pattern from an input vector; and (ii) an encoder model for converting an input image to a one dimensional (1D) vector, and (b) a target pattern; and training the encoder model in cooperation with the trained generator model. The training includes executing the encoder model using the target pattern as the input image to generate the 1D vector; executing the trained generator model using the generated 1D vector as the input vector to generate the characteristic pattern; and adjusting model parameters of the encoder model such that a performance metric of a patterning process is reduced. In an embodiment, the performance metric is determined, via simulating the patterning process using the mask pattern including the characteristic pattern.

Furthermore, there is provided a method of training a machine learning model configured to generate a characteristic pattern for a mask pattern. The method includes obtaining the machine learning model comprising: (i) an encoder model for converting an input image to a one dimensional (1D) vector; and (ii) a decoder model configured to generate the characteristic pattern from an input vector; and training the encoder model in cooperation with the decoder model. The training includes executing the encoder model using a reference characteristic pattern as the input image to generate the 1D vector, wherein the reference characteristic pattern meets a satisfactory threshold associated with manufacturing the mask pattern; executing the decoder model using the generated 1D vector as the input vector to generate the characteristic pattern; and adjusting model parameters of the encoder model and the decoder model such that a metric between the generated characteristic pattern and the reference characteristic pattern is reduced.

In an embodiment, the method of training further includes a second stage of training. The second stage includes obtaining a second encoder model configured to convert a target pattern to the 1D vector; and training the second encoder model in cooperation with the trained decoder model. The training of the second encoder includes executing the second encoder model using the target pattern as the input image to generate the 1D vector; executing the trained decoder model using the generated 1D vector as the input vector to generate the characteristic pattern; and adjusting model parameters of the second encoder model such that a performance metric of a patterning process is reduced. In an embodiment, the performance metric is determined, via simulating the patterning process using the mask pattern including the characteristic pattern.

According to the present disclosure, the combination and sub-combinations of disclosed elements constitute separate embodiments. For example, a combination of CTM and a reference characteristic pattern as input data set for training a machine learning model (e.g., 405) can be a separate embodiment. Similarly, a 1D vector generated from the CTM images used for training another machine learning model (e.g., the encoder 515) can be another embodiment. Furthermore, each of the training process namely the supervised learning flow, the unsupervised learning flow, the GAN flow, the two stage GAN flow, or the autoencoder flow can be considered as separate embodiments.

The embodiments may further be described using the following clauses:

1. A method of training a machine learning model configured to generate a characteristic pattern for a mask pattern, the method comprising:

obtaining (i) a reference characteristic pattern that meets a satisfactory threshold related to manufacturing of the mask pattern and a sharpness threshold, and (ii) a continuous transmission mask (CTM) for use in generating the mask pattern; and training, based on the reference characteristic pattern and the CTM, the machine learning model such that a first metric between the characteristic pattern and the CTM, and a second metric between the characteristic pattern and the reference characteristic pattern is reduced.

2. The method of clause 1, wherein the reference characteristic pattern includes a plurality of reference characteristic patterns, each reference characteristic pattern meeting the satisfactory threshold related to manufacturing of the mask pattern including the sharpness threshold.

3. The method of any of clauses 1-2, wherein the training is an iterative process comprising:

(a) executing, the machine learning model using the CTM, to output characteristic pattern;

(b) determining the first metric between the outputted characteristic pattern and the CTM, and the second metric between the outputted characteristic pattern and the reference characteristic pattern; and (c) adjusting the machine learning model such that the first metric, the second metric, and/or a combination thereof is reduced;

(d) determining whether the first metric, the second metric, and/or the combination thereof is minimized; and (e) responsive to not minimized, performing steps (a), (b), (c), and (d).

4. The method of any of clauses-1-3, further comprising:

determining, via executing the trained machine learning model using a given CTM, a characteristic pattern; and extracting contours of the characteristic pattern, the contours being used for generating the mask pattern.

5. The method of any of clauses 1-4, wherein the reference characteristic pattern is a pixelated image generated based on design rules related to manufacturing of the mask pattern and the sharpness threshold of features therein.

6. The method of any of clauses 1-5, wherein the CTM is an image generated by simulating an optical proximity correction process using a target pattern to be printed on a substrate.

7. The method of clause 6, wherein the characteristic pattern comprises sub-resolution features placed around a target feature of the target pattern, the sub-resolution features being rectilinear in shape.

8. The method of clause 1-7, wherein computing the first metric comprises:

transforming, via a transfer function, the characteristic pattern; and determining a difference between the transformed characteristic pattern and the CTM, wherein the transfer function includes at least one of: a low pass filter or a blurring function.

9. A method of training a machine learning model configured to generate a characteristic pattern for a mask pattern, the method comprising:

obtaining (a) the machine learning model comprising: (i) a generator model configured to generate the characteristic pattern from a continuous transmission mask (CTM); and (ii) a discriminator model configured to determines whether an input pattern meets a satisfactory threshold related to the manufacturing of the mask pattern and a sharpness threshold, and (b) a reference characteristic pattern that meets the satisfactory threshold related to manufacturing of the mask pattern and the sharpness threshold; and training the generator model and the discriminator model in a cooperative manner such that: (i) the generator model generates the characteristic pattern using the CTM, and the discriminator model determines that the characteristic pattern and the reference characteristic pattern as meeting the satisfactory threshold including the sharpness threshold, and (ii) a metric between the generated characteristic pattern and the CTM is reduced.

10. The method of clause 9, wherein the training of the generator model and the discriminator model is an iterative process, an iteration comprises:

generating, via executing the generator model using the CTM, the characteristic pattern;

evaluating a first cost function associated with the generator model, the first cost function being a function of (i) a first probability that the discriminator model determines whether the characteristic pattern as meeting the satisfactory threshold including the sharpness threshold, and (ii) the metric between the generated characteristic pattern and the CTM;

determining, via the discriminator model, the characteristic pattern and the reference characteristic pattern as meeting or not meeting the satisfactory threshold including the sharpness threshold;

evaluating a second cost function associated with the discriminator model, the second cost function being another function of (i) the first probability that the characteristic pattern is determined as not meeting the satisfactory threshold including the sharpness threshold and (ii) a second probability that the reference characteristic pattern is determined as meeting the satisfactory threshold including the sharpness threshold; and adjusting first parameters of the generator model to (i) increase the first probability that the discriminator model determines the characteristic pattern as meeting the satisfactory threshold including the sharpness threshold, and (ii) reduce the metric between the generated characteristic pattern and the CTM, and/or reduce a performance metric associated with a patterning process; and/or adjusting second parameters of the discriminator model to improve the second cost function.

11. The method of clause 10, wherein the first cost function includes the performance metric associated with the patterning process.

12. The method of clause 11, wherein the generator model is trained to minimize the performance metric, wherein the performance metric is determined via simulating the patterning process using a mask pattern, the mask pattern including one or more features extracted from the characteristic pattern.

13. The method of clause 12, wherein the performance metric is at least one of:

a critical dimension error related to a feature to be printed on a substrate;

an edge placement error between the feature to be printed on the substrate and a target feature; or a pattern placement error between two or more features to be printed on the substrate.

14. The method of any of clauses 10-13, wherein the first cost function comprises a first log-likelihood term that determines the first probability that the characteristic pattern is a fake.

15. The method of clause 14, wherein the adjusting of parameters of the generator model is such that the first log-likelihood term is minimized.

16. The method of any of clauses 9-15, wherein the second cost function includes a second log-likelihood term that determines the first probability that the characteristic pattern is fake and the second probability that the reference characteristic pattern is real.

17. The method of any of clauses 9-16, wherein the adjusting of the second model parameters is such that the second log-likelihood term is maximized.

18. The method of any of clauses 8-16, the characteristic pattern includes features having substantially rectilinear pattern.

19. The method of any of clauses 8-18, further comprising:

generating, via executing the trained generator model using a given CTM, sub-resolution features for a mask pattern, wherein the sub-resolution features have rectilinear shapes.

20. The method of any of clauses 8-19, wherein the generator model and the discriminator model are convolutional neural networks (CNN).

21. The method of any of clauses 8-20, further comprising:

outputting, via executing the trained generator model using a given CTM, a characteristic pattern, the outputted characteristic pattern meeting the satisfactory threshold associated with manufacturing of the mask pattern; and extracting contours of the outputted characteristic pattern, the contours being used for generating the mask pattern.

22. The method of clause 21, wherein the outputted characteristic pattern comprises sub-resolution features having rectilinear in shape.

23. A method of training a machine learning model configured to generate a characteristic pattern for a mask pattern, the method comprising:

obtaining (a) the machine learning model comprising: (i) a trained generator model configured to generate the characteristic pattern from an input vector; and (ii) an encoder model for converting an input image to a one dimensional (1D) vector, and (b) a continuous transmission mask (CTM) used for generating the mask pattern; and training the encoder model in cooperation with the trained generator model, the training comprising:

executing the encoder model using the CTM as the input image to generate the 1D vector;

executing the trained generator model using the generated 1D vector as the input vector to generate the characteristic pattern; and adjusting model parameters of the encoder model such that a metric between the generated characteristic pattern and the CTM is reduced.

24. The method of clause 23, wherein the obtaining of the trained generator model an iterative process, an iteration comprises:

generating, via executing a generator model using a 1D noise vector as the input vector, the characteristic pattern;

evaluating a first cost function associated with the generator model, the first cost function being a function of a first probability that the discriminator model determines the characteristic pattern as not meeting a satisfactory threshold related to manufacturing of the mask pattern;

determining, via a discriminator model, the characteristic pattern and a reference characteristic pattern as meeting the satisfactory threshold or not meeting the satisfactory threshold, the discriminator model being configured to determine whether an input pattern meets the satisfactory threshold or does not meet the satisfactory threshold, and the reference pattern characteristic considered as meeting the satisfactory threshold;

evaluating a second cost function associated with the discriminator model, the second cost function being a function of (i) the first probability that the characteristic pattern is determined as not meeting the satisfactory threshold and (ii) a second probability that the reference characteristic function is determined as meeting the satisfactory threshold; and adjusting first parameters of the generator model to (i) increase the first probability that the discriminator model determines the characteristic pattern as meeting the satisfactory threshold; and/or adjusting second parameters of the discriminator model to maximize the second cost function.

25. The method of any of clauses 23-24, wherein the training of the encoder model comprising:

(a) executing the encoder model using the CTM as the input image to generate the 1D vector;

(b) executing the trained generator model using the generated 1D vector as the input vector to generate the characteristic pattern;

(c) adjusting the model parameters of the encoder model such that the metric between the generated characteristic pattern and the CTM is reduced and/or a performance metric associated with a patterning process is reduced; and repeating (a), (b), and (c) until the metric is minimized.

26. The method of clause 25, wherein the encoder model is trained to minimize the performance metric, wherein the performance metric is determined via simulating the patterning process using a mask pattern, the mask pattern including one or more features extracted from the characteristic pattern.

27. The method of clause 26, wherein the performance metric is at least one of:

a critical dimension error related to a feature to be printed on a substrate;

an edge placement error between the feature to be printed on the substrate and a target feature; or a pattern placement error between two or more to be printed features on the substrate.

28. The method of any of clauses 23-27, further comprising:

generating, via executing the trained machine learning model using a given CTM, the characteristic pattern including sub-resolution features for a mask pattern, wherein the sub-resolution features have rectilinear shapes, and wherein the trained machine learning model comprises the trained encoder model that converts the given CTM to the 1D vector and the trained generator model converts the 1D vector to the characteristic pattern.

29. The method of any of clauses 24-28, wherein the encoder model, the trained generator model, the discriminator model, or a combination thereof are convolutional neural networks (CNN).

30. A method of training a machine learning model configured to generate a characteristic pattern for a mask, the method comprising:

obtaining the machine learning model comprising: (i) an encoder model for converting an input image to a one dimensional (1D) vector; and (ii) a decoder model configured to generate the characteristic pattern from an input vector; and training the encoder model in cooperation with the decoder model, the training comprising:

executing the encoder model using a reference characteristic pattern as the input image to generate the 1D vector, wherein the reference characteristic pattern meets a satisfactory threshold associated with manufacturing the mask pattern;

executing the decoder model using the generated 1D vector as the input vector to generate the characteristic pattern; and adjusting model parameters of the encoder model and the decoder model such that a metric between the generated characteristic pattern and the reference characteristic pattern is reduced.

31. The method of clause 30, wherein the training of the encoder model and the decoder model comprising:

(a) executing the encoder model using the reference characteristic pattern as the input image to generate the 1D vector;

(b) executing the decoder model using the generated 1D vector as the input vector to generate the characteristic pattern;

(c) adjusting the model parameters of the encoder model and the decoder model such that the metric between the generated characteristic pattern and the reference pattern is reduced; and repeating (a), (b), and (c) until the metric is minimized.

32. The method of any of clauses 30-31, further comprising:

obtaining a second encoder model configured to convert a continuous transmission mask (CTM) used for generating the mask pattern to the 1D vector; and training the second encoder model in cooperation with the trained decoder model, the training comprising:

executing the second encoder model using the CTM as the input image to generate the 1D vector;

executing the trained decoder model using the generated 1D vector as the input vector to generate the characteristic pattern; and adjusting model parameters of the second encoder model such that another metric between the generated characteristic pattern and the CTM is reduced and/or a performance metric associated with a patterning process is reduced.

33. The method of clause 32, wherein the encoder model and the decoder model are trained to minimize the performance metric, wherein the performance metric is determined via simulating the patterning process using a mask pattern, the mask pattern including one or more features extracted from the characteristic pattern.

34. The method of clause 33, wherein the performance metric is at least one of:

a critical dimension error related to a feature to be printed on a substrate;

an edge placement error between the feature to be printed on the substrate and a target feature; or a pattern placement error between two or more to be printed features on the substrate.

35. The method of any of clauses 30-34, further comprising:

generating, via executing the trained second encoder model and the trained decoder model using a given CTM, the characteristic pattern including sub-resolution features for a mask pattern, wherein the sub-resolution features have rectilinear shapes.

36. The method of any of clauses 30-35, wherein the encoder model, the second encoder model, the decoder model, or a combination thereof are convolutional neural networks (CNN).

37. The method of any of clauses 30-36, wherein a variational autoencoder method is employed, wherein the encoder model is configured to generate the 1D vector and a statistical vector, and wherein the training process includes adjusting model parameters to minimize a Kullback Leibler divergence of the variation vector.

38. A method of training a machine learning model configured to generate a characteristic pattern for a mask pattern, the method comprising:

obtaining (i) a reference characteristic pattern that meets a satisfactory threshold related to manufacturing of the mask pattern and a sharpness threshold, and (ii) a target pattern; and training, based on the reference characteristic pattern and the target, the machine learning model such that a metric between the characteristic pattern and the reference characteristic pattern is reduced and a performance metric associated with a patterning process is reduced.

39. The method of clause 38, wherein the machine learning model is trained to minimize the performance metric, wherein the performance metric is determined via simulating the patterning process using a mask pattern, the mask pattern including one or more features extracted from the characteristic pattern.

40. The method of clause 39, wherein the performance metric is at least one of:

a critical dimension error between a simulated feature and a target feature of the target pattern to be printed on a substrate;

an edge placement error between the simulated feature and the target feature to be printed on the substrate; or a pattern placement error between two or more simulated features to be printed features on the substrate.

41. The method of any of clauses 38-40, wherein the reference characteristic pattern is a pixelated image generated based on design rules related to manufacturing of the mask pattern and the sharpness threshold of features therein.

42. The method of clause 38-41, wherein the characteristic pattern comprises sub-resolution features placed around a target feature of the target pattern, the sub-resolution features being rectilinear in shape.

43. A method of training a machine learning model configured to generate a characteristic pattern for a mask pattern, the method comprising:

obtaining (i) a reference characteristic pattern that meets a satisfactory threshold related to manufacturing of the mask pattern and a sharpness threshold, and (ii) a continuous transmission mask (CTM) for use in generating the mask pattern; and training, based on the reference characteristic pattern and the CTM, the machine learning model such that a difference between the characteristic pattern and the reference characteristic pattern is reduced.

44. The method of clause 43, wherein the training is an iterative process comprising:

(a) executing, the machine learning model using the CTM, to output the characteristic pattern;

(b) determining the difference between the outputted characteristic pattern and the reference characteristic pattern; and (c) adjusting the machine learning model such that the difference is reduced;

(d) determining whether the difference is minimized; and (e) responsive to the difference not minimized, repeating steps (a), (b), (c), and (d).

45. A computer program product comprising a non-transitory computer readable medium having instructions recorded thereon, the instructions when executed by a computer implementing the method of any of the above clauses.

In an embodiment, procedures of the methods discussed above can be implemented on one or more processors of a computer system, discussed below.

Figure 12:
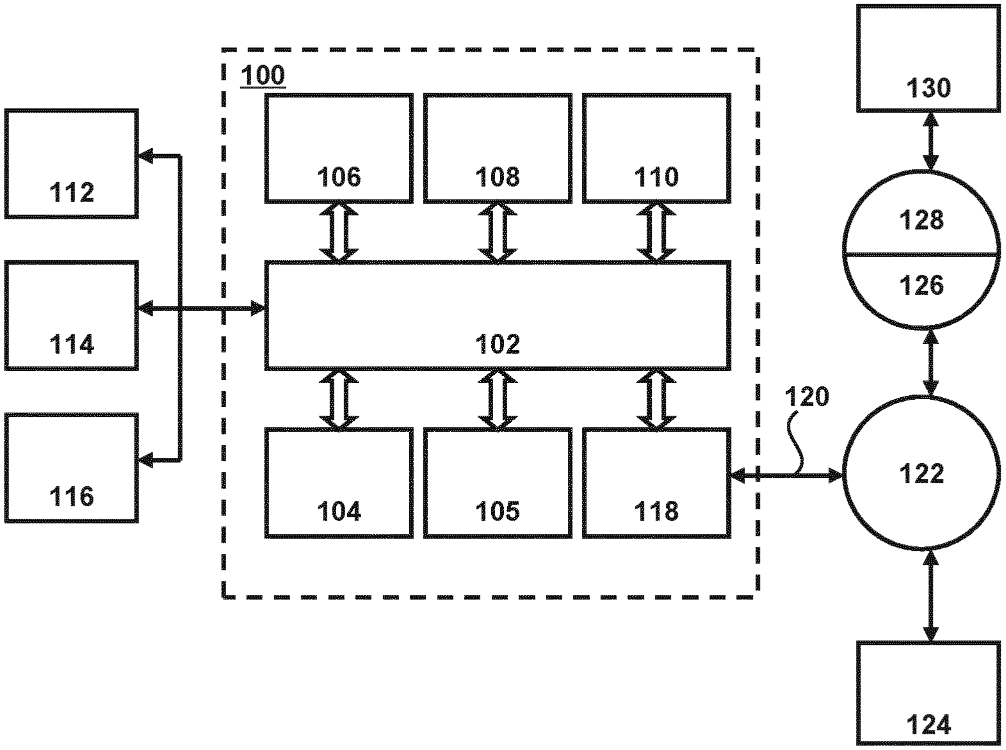
FIG. 12 is a block diagram of an example computer system, according to an embodiment.

FIG. 12 is a block diagram that illustrates a computer system 100 which can assist in implementing the methods, flows or the apparatus disclosed herein. Computer system 100 includes a bus 102 or other communication mechanism for communicating information, and a processor 104 (or multiple processors 104 and 105) coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment, portions of one or more methods described herein may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 may also include a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. One such downloaded application may provide all or part of a method described herein, for example. The received code may be executed by processor 104 as it is received, and/or stored in storage device 110, or other non-volatile storage for later execution. In this manner, computer system 100 may obtain application code in the form of a carrier wave.

Figure 13:
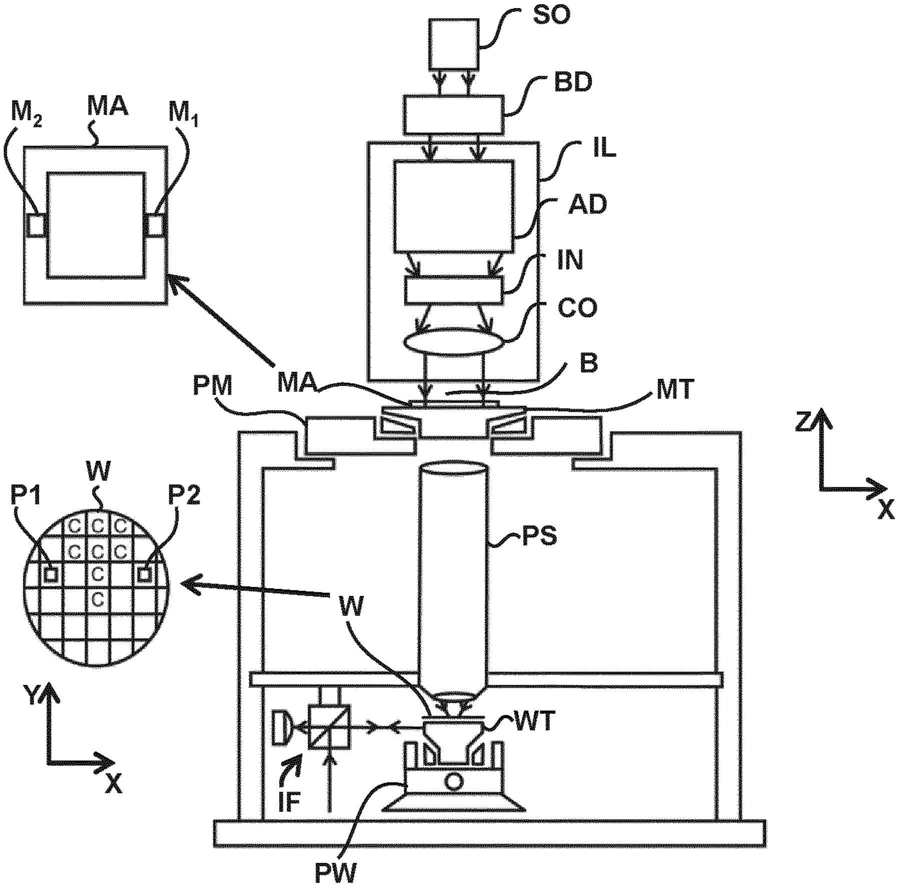
FIG. 13 is a schematic diagram of a lithographic projection apparatus, according to an embodiment.

FIG. 13 schematically depicts an exemplary lithographic projection apparatus in conjunction with the techniques described herein can be utilized. The apparatus comprises:

an illumination system IL, to condition a beam B of radiation. In this particular case, the illumination system also comprises a radiation source SO;

a first object table (e.g., patterning device table) MT provided with a patterning device holder to hold a patterning device MA (e.g., a reticle), and connected to a first positioner to accurately position the patterning device with respect to item PS;

a second object table (substrate table) WT provided with a substrate holder to hold a substrate W (e.g., a resist-coated silicon wafer), and connected to a second positioner to accurately position the substrate with respect to item PS;

a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive patterning device). However, in general, it may also be of a reflective type, for example (with a reflective patterning device). The apparatus may employ a different kind of patterning device to classic mask; examples include a programmable mirror array or LCD matrix.

The source SO (e.g., a mercury lamp or excimer laser, LPP (laser produced plasma) EUV source) produces a beam of radiation. This beam is fed into an illumination system (illuminator) IL, either directly or after having traversed conditioning means, such as a beam expander Ex, for example. The illuminator IL may comprise adjusting means AD for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam B impinging on the patterning device MA has a desired uniformity and intensity distribution in its cross-section.

It should be noted with regard to FIG. 13 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing).

The beam PB subsequently intercepts the patterning device MA, which is held on a patterning device table MT. Having traversed the patterning device MA, the beam B passes through the lens PL, which focuses the beam B onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted in FIG. 13. However, in the case of a stepper (as opposed to a step-and-scan tool) the patterning device table MT may just be connected to a short stroke actuator, or may be fixed.

The depicted tool can be used in two different modes:

In step mode, the patterning device table MT is kept essentially stationary, and an entire patterning device image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 14:
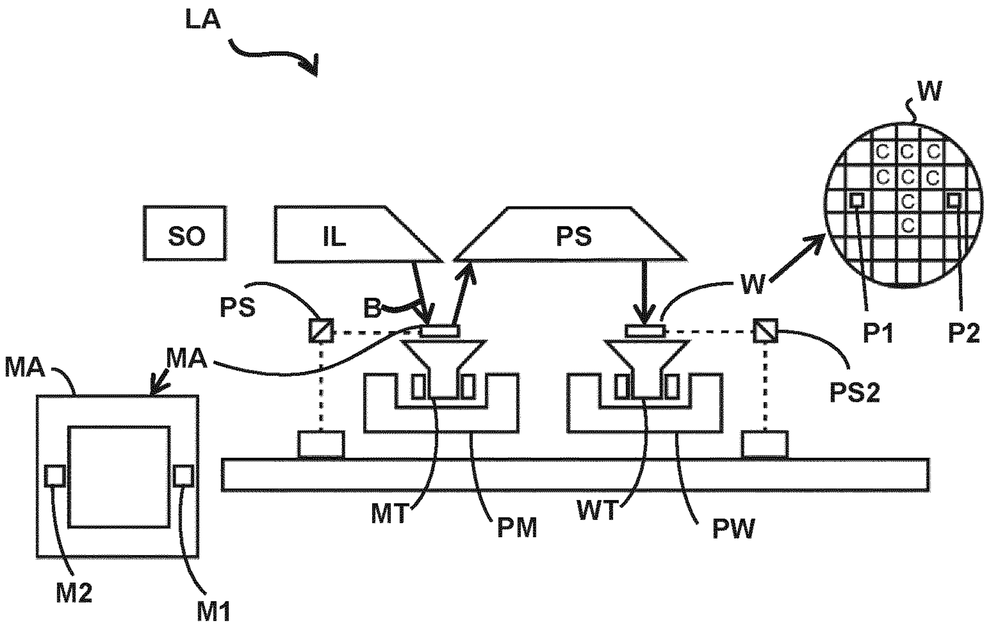
FIG. 14 is a schematic diagram of another lithographic projection apparatus, according to an embodiment.

FIG. 14 schematically depicts another exemplary lithographic projection apparatus LA in conjunction with the techniques described herein can be utilized.

The lithographic projection apparatus LA comprises:

a source collector module SO an illumination system (illuminator) IL configured to condition a radiation beam B (e.g. EUV radiation).

a support structure (e.g. a patterning device table) MT constructed to support a patterning device (e.g. a mask or a reticle) MA and connected to a first positioner PM configured to accurately position the patterning device;

a substrate table (e.g. a wafer table) WT constructed to hold a substrate (e.g. a resist coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

As here depicted, the apparatus LA is of a reflective type (e.g. employing a reflective patterning device). It is to be noted that because most materials are absorptive within the EUV wavelength range, the patterning device may have multilayer reflectors comprising, for example, a multi-stack of Molybdenum and Silicon. In one example, the multi-stack reflector has a 40 layer pairs of Molybdenum and Silicon where the thickness of each layer is a quarter wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 14, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 14, for providing the laser beam exciting the fuel. The resulting plasma emits output radiation, e.g., EUV radiation, which is collected using a radiation collector, disposed in the source collector module. The laser and the source collector module may be separate entities, for example when a CO2 laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., patterning device table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus LA could be used in at least one of the following modes:

1. In step mode, the support structure (e.g. patterning device table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.
2. In scan mode, the support structure (e.g. patterning device table) MT and the substrate table WT are scanned synchronously while a pattern imparted to the radiation beam is projected onto a target portion C (i.e. a single dynamic exposure). The velocity and direction of the substrate table WT relative to the support structure (e.g. patterning device table) MT may be determined by the (de-)magnification and image reversal characteristics of the projection system PS.
3. In another mode, the support structure (e.g. patterning device table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 15:
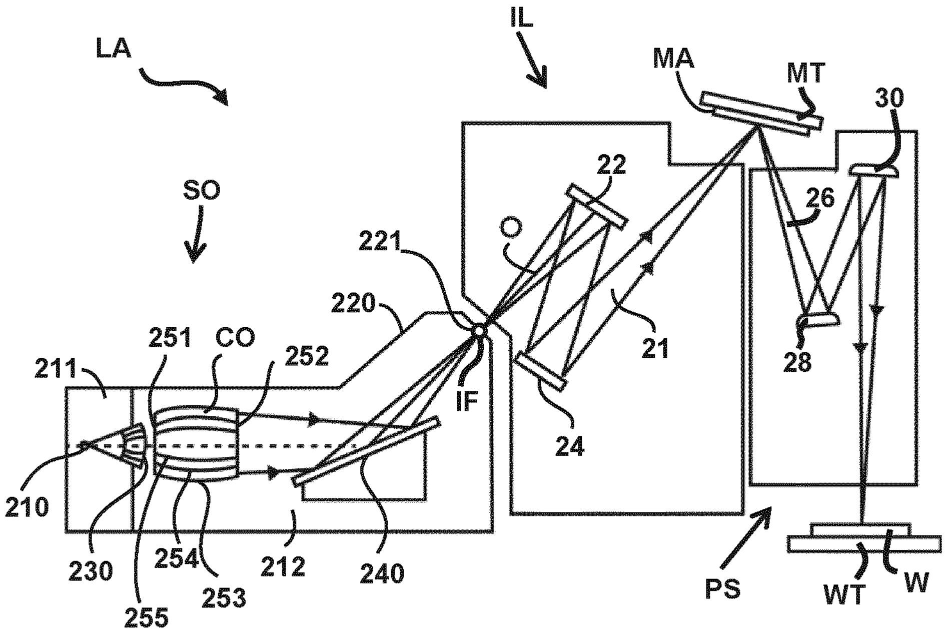
FIG. 15 is a more detailed view of the apparatus in FIG. 13, according to an embodiment.

FIG. 15 shows the apparatus LA in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 15.

Collector optic CO, as illustrated in FIG. 15, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type may be used in combination with a discharge produced plasma source, often called a DPP source.

Figure 16:
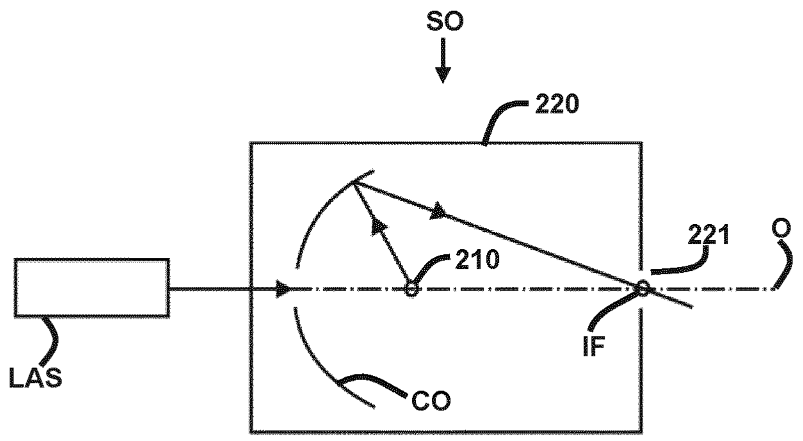
FIG. 16 is a more detailed view of the source collector module SO of the apparatus of FIG. 14 and FIG. 15, according to an embodiment.

Alternatively, the source collector module SO may be part of an LPP radiation system as shown in FIG. 16. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

The descriptions above are intended to be illustrative, not limiting. Thus, it will be apparent to one skilled in the art that modifications may be made as described without departing from the scope of the claims set out below.

What is claimed is:

1. A method comprising:

obtaining
- (a) a machine learning model comprising:
  - (i) a generator model configured to generate a characteristic pattern from a continuous transmission mask (CTM); and
  - (ii) a discriminator model configured to determine whether an input pattern meets a satisfactory threshold related to manufacturing of a mask pattern and a sharpness threshold, and
- (b) a reference characteristic pattern that meets the satisfactory threshold related to manufacturing of the mask pattern and the sharpness threshold; and training, by a hardware computer system, the generator model and the discriminator model in a cooperative manner such that:

(i) the generator model generates the characteristic pattern using the CTM, and the discriminator model determines that the characteristic pattern and the reference characteristic pattern as meeting the satisfactory threshold and the sharpness threshold, and (ii) a metric between the generated characteristic pattern and the CTM is reduced, wherein the metric is based on a difference between the generated characteristic pattern and the CTM.

2. The method of claim 1, wherein the training of the generator model and the discriminator model is an iterative process, an iteration comprising:

generating, via executing the generator model using the CTM, the characteristic pattern;

evaluating a first cost function associated with the generator model, the first cost function being a function of (i) a probability that the discriminator model determines whether the characteristic pattern as meeting the satisfactory threshold and the sharpness threshold, and (ii) the metric between the generated characteristic pattern and the CTM;

determining, via the discriminator model, the characteristic pattern and the reference characteristic pattern as meeting or not meeting the satisfactory threshold and the sharpness threshold;

evaluating a second cost function associated with the discriminator model, the second cost function being another function of (i) a probability that the characteristic pattern is determined as not meeting the satisfactory threshold and the sharpness threshold and (ii) a probability that the reference characteristic pattern is determined as meeting the satisfactory threshold and the sharpness threshold; and adjusting:
- one or more parameters of the generator model to (i) increase a probability that the discriminator model determines the characteristic pattern as meeting the satisfactory threshold and the sharpness threshold, and (ii) reduce the metric between the generated characteristic pattern and the CTM, and/or reduce a performance metric associated with a patterning process; and/or
- one or more parameters of the discriminator model to improve the second cost function.

3. The method of claim 2, wherein the first cost function includes the performance metric associated with the patterning process.

4. The method of claim 3, wherein the generator model is trained to minimize the performance metric, wherein the performance metric is determined via simulating the patterning process using a mask pattern, the mask pattern including one or more features extracted from the characteristic pattern, and/or wherein the performance metric is at least one selected from:
- a critical dimension error related to a feature to be printed on a substrate;
- an edge placement error between the feature to be printed on the substrate and a target feature; or
- a pattern placement error between two or more features to be printed on the substrate.

5. The method of claim 2, wherein the first cost function comprises a log-likelihood term that determines a probability that the characteristic pattern is a fake.

6. The method of claim 2, wherein the second cost function includes a log-likelihood term that determines a probability that the characteristic pattern is fake and a probability that the reference characteristic pattern is real.

7. The method of claim 2, wherein the second cost function includes a log-likelihood term that determines a probability that the characteristic pattern is fake and the adjusting of the one or more parameters of the discriminator model is such that the log-likelihood term is maximized.

8. The method of claim 1, wherein the reference characteristic pattern is a pixelated image generated based on design rules related to manufacturing of the mask pattern and the sharpness threshold of features therein.

9. The method of claim 1, wherein the CTM is an image generated by simulating an optical proximity correction process using a target pattern to be printed on a substrate.

10. The method of claim 1, wherein the characteristic pattern includes features having a substantially rectilinear pattern.

11. The method of claim 1, further comprising generating, via executing the trained generator model using a given CTM, sub-resolution features, wherein the sub-resolution features have rectilinear shapes.

12. The method of claim 1, wherein the generator model and the discriminator model are convolutional neural networks (CNN).

13. The method of claim 1, further comprising:

outputting, via executing the trained generator model using a given CTM, an output characteristic pattern, the output characteristic pattern meeting the satisfactory threshold associated with manufacturing of the mask pattern; and extracting a contour of the output characteristic pattern, the contour being used for generating the mask pattern.

14. The method of claim 13, wherein the output characteristic pattern comprises one or more sub-resolution features being rectilinear in shape.

15. The method of claim 1, wherein the generator model is pre-trained in cooperation with the discriminator model using an input vector prior to training using the CTM.

16. The method of claim 15, further comprising:

fixing parameters of the generator model after the cooperative training such that the generator model is used as a pretrained pattern library; and training an encoder model to convert the CTM into an input vector for the fixed generator model.

17. A computer program product comprising a non-transitory computer readable medium having instructions therein, the instructions, when executed by a computer system, configured to cause the computer system to at least:

obtain (a) a machine learning model comprising:

(i) a generator model configured to generate a characteristic pattern from a continuous transmission mask (CTM); and (ii) a discriminator model configured to determine whether an input pattern meets a satisfactory threshold related to manufacturing of a mask pattern and a sharpness threshold, and (b) a reference characteristic pattern that meets the satisfactory threshold related to manufacturing of the mask pattern and the sharpness threshold; and train the generator model and the discriminator model in a cooperative manner such that:

(i) the generator model generates the characteristic pattern using the CTM, and the discriminator model determines that the characteristic pattern and the reference characteristic pattern as meeting the satisfactory threshold and the sharpness threshold, and (ii) a metric between the generated characteristic pattern and the CTM is reduced, wherein the metric is based on a difference between the generated characteristic pattern and the CTM.

18. The computer program product of claim 17, wherein the instructions configured to cause the computer system to train the generator model and the discriminator model are configured to do so in an iterative manner, an iteration comprising:

generation, via execution of the generator model using the CTM, of the characteristic pattern;

evaluation of a first cost function associated with the generator model, the first cost function being a function of (i) a probability that the discriminator model determines whether the characteristic pattern as meeting the satisfactory threshold and the sharpness threshold, and (ii) the metric between the generated characteristic pattern and the CTM;

determination, via the discriminator model, of the characteristic pattern and the reference characteristic pattern as meeting or not meeting the satisfactory threshold and the sharpness threshold;

evaluation of a second cost function associated with the discriminator model, the second cost function being another function of (i) a probability that the characteristic pattern is determined as not meeting the satisfactory threshold and the sharpness threshold and (ii) a probability that the reference characteristic pattern is determined as meeting the satisfactory threshold and the sharpness threshold; and adjustment of:

one or more parameters of the generator model to (i) increase a probability that the discriminator model determines the characteristic pattern as meeting the satisfactory threshold and the sharpness threshold, and (ii) reduce the metric between the generated characteristic pattern and the CTM, and/or reduce a performance metric associated with a patterning process; and/or one or more parameters of the discriminator model to improve the second cost function.

19. The computer program product of claim 17, wherein the reference characteristic pattern is a pixelated image generated based on design rules related to manufacturing of the mask pattern and the sharpness threshold of features therein.

20. The computer program product of claim 17, wherein the CTM is an image generated by simulating an optical proximity correction process using a target pattern to be printed on a substrate.

21. The computer program product of claim 17, wherein the characteristic pattern includes features having a substantially rectilinear pattern.

22. The computer program product of claim 17, wherein the instructions are further configured to cause the computer system to generate, via executing the trained generator model using a given CTM, sub-resolution features, wherein the sub-resolution features have rectilinear shapes.

23. The computer program product of claim 17, wherein the instructions are further configured to cause the computer system to:

output, via executing the trained generator model using a given CTM, an output characteristic pattern, the output characteristic pattern meeting the satisfactory threshold associated with manufacturing of the mask pattern; and extract a contour of the output characteristic pattern, the contour being used for generating the mask pattern.

24. The computer program product of claim 17, wherein the generator model is pre-trained in cooperation with the discriminator model using an input vector prior to training using the CTM.

25. The computer program product of claim 24, further comprising:

fixing parameters of the generator model after the cooperative training such that the generator model is used as a pretrained pattern library; and training an encoder model to convert the CTM into an input vector for the fixed generator model.

* * * * *